US012575160B2

(12) United States Patent
Xie et al.

(10) Patent No.: US 12,575,160 B2
(45) Date of Patent: Mar. 10, 2026

(54) BACKSIDE AND FRONTSIDE CONTACTS FOR SEMICONDUCTOR DEVICE

(71) Applicant: International Business Machines Corporation, Armonk, NY (US)

(72) Inventors: Ruilong Xie, Niskayuna, NY (US); Chanro Park, Clifton Park, NY (US); Min Gyu Sung, Latham, NY (US); Kangguo Cheng, Schenectady, NY (US); Julien Frougier, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 684 days.

(21) Appl. No.: 17/896,885

(22) Filed: Aug. 26, 2022

(65) Prior Publication Data

US 2024/0072133 A1 Feb. 29, 2024

(51) Int. Cl.
H10D 64/23 (2025.01)
H10D 30/01 (2025.01)
(Continued)

(52) U.S. Cl.
CPC ....... H10D 64/251 (2025.01); H10D 30/0198 (2025.01); H10D 64/256 (2025.01); H10D 84/0149 (2025.01); H10D 84/0186 (2025.01); *H10D 30/501* (2025.01); *H10D 30/6735* (2025.01); *H10D 30/6757* (2025.01); *H10D 62/121* (2025.01)

(58) Field of Classification Search
CPC ............... H10D 64/251; H10D 64/256; H10D 30/0198; H10D 30/501; H10D 30/6735; H10D 30/6757; H10D 84/0149; H10D 84/0186; H10D 62/121
See application file for complete search history.

(56) References Cited

U.S. PATENT DOCUMENTS 9,570,395 B1    2/2017   Sengupta et al.
10,586,765 B2   3/2020   Smith et al.
(Continued)

FOREIGN PATENT DOCUMENTS

EP            3671825 A1    6/2020

OTHER PUBLICATIONS

Salahuddin S, Perumkunnil M, Litta ED, Gupta A, Weckx p. Ryckaert J, Na MH, Spessot A. Buried power SRAM DTCO and system-level benchmarking in N3. In2020 IEEE Symposium on VLSI Technology Jun. 16, 2020 (pp. 1-2). IEEE.
(Continued)

*Primary Examiner* — Joseph C. Nicely
(74) *Attorney, Agent, or Firm* — Samuel Waldbaum; Otterstedt & Kammer PLLC

(57) ABSTRACT

Backside and frontside contact structures wrapping around source/drain regions provide increased contact areas for electrical connections and allow increased silicide areas. Sidewall metallization of epitaxially grown source/drain regions provides source/drain sidewall contacts that enable wrap-around contact formation on both the front side and the back side of a semiconductor device layer. Front side and back side contact metallization over the source/drain sidewall contacts allows wrap-around contact structures on both sides of the device layer.

20 Claims, 21 Drawing Sheets

(51) Int. Cl.

| | | |
|---|---|---|
| *H10D 84/01* | (2025.01) | |
| *H10D 30/00* | (2025.01) | |
| *H10D 30/67* | (2025.01) | |
| *H10D 62/10* | (2025.01) | |

(56) References Cited

U.S. PATENT DOCUMENTS

| | | | |
|---|---|---|---|
| 10,636,739 | B2 | 4/2020 | Beyne et al. |
| 10,658,483 | B2 | 5/2020 | Leobandung |
| 10,700,207 | B2 | 6/2020 | Chen et al. |
| 10,886,217 | B2 | 1/2021 | Morrow |
| 10,950,722 | B2 | 3/2021 | Zhang |
| 11,227,799 | B2 | 1/2022 | Mehandru |
| 11,264,493 | B2 | 3/2022 | Morrow |
| 2019/0157310 | A1 | 5/2019 | Glass |
| 2019/0214502 | A1* | 7/2019 | Xu ..................... H10D 30/0323 |
| 2020/0075772 | A1* | 3/2020 | Xu ..................... H10D 30/0323 |
| 2020/0105671 | A1 | 4/2020 | Lai et al. |
| 2020/0219997 | A1 | 7/2020 | Mehandru |
| 2020/0294860 | A1* | 9/2020 | Chang .............. H01L 21/76895 |
| 2021/0111115 | A1 | 4/2021 | Morrow et al. |
| 2021/0134721 | A1 | 5/2021 | Chiang et al. |
| 2021/0202385 | A1 | 7/2021 | Huang et al. |
| 2021/0305252 | A1 | 9/2021 | Chiang et al. |
| 2021/0305381 | A1 | 9/2021 | Chiang et al. |
| 2021/0336019 | A1 | 10/2021 | Su |
| 2021/0336020 | A1 | 10/2021 | Yu |
| 2021/0343645 | A1 | 11/2021 | Peng |
| 2021/0351303 | A1 | 11/2021 | Ju et al. |
| 2021/0376071 | A1 | 12/2021 | Liu et al. |
| 2021/0376093 | A1 | 12/2021 | Chu et al. |
| 2021/0399099 | A1 | 12/2021 | Chu |
| 2021/0399109 | A1* | 12/2021 | Su ........................ H10D 62/121 |
| 2023/0063786 | A1* | 3/2023 | Liao ..................... H10D 64/254 |
| 2024/0063121 | A1* | 2/2024 | Xie ..................... H01L 23/5283 |

OTHER PUBLICATIONS

Prasad D, Nibhanupudi ST, Das S, Zografos O, Chehab B, Sarkar S, Baert R, Robinson A, Gupta A, Spessot A, Debacker P. Buried power rails and back-side power grids: Arm® CPU power delivery network design beyond 5nm. In2019 IEEE International Electron Devices Meeting (IEDM) Dec. 7, 2019 (pp. 19-1). IEEE. (abstract only 3 pages).

Gupta A, Mertens H, Tao Z, Demuynck S, Bommels J, Arutchelvan G, Devriendt K, Pedreira OV, Ritzenthaler R, Wang S, Radisic D. Buried Power Rail Integration with Si FinFETs for CMOS Scaling beyond the 5 nm Node. In2020 IEEE Symposium on VLSI Technology Jun. 16, 2020 (pp. 1-2). IEEE.(abstract only 2 pages).

Authorized officer Jensen, Pernille. European Patent Office counterpart PCT application PCT/EP2023/071465 ISR & WO mailed on Nov. 13, 2023. pp. 14.

\* cited by examiner

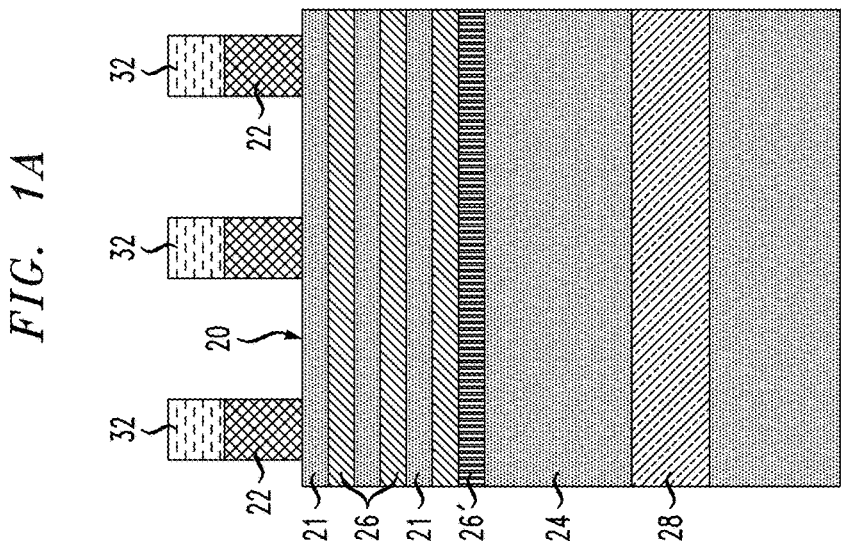

BACKSIDE AND FRONTSIDE CONTACTS FOR SEMICONDUCTOR DEVICE

BACKGROUND

The present invention relates generally to the electrical, electronic and computer arts and, more particularly, to FET architectures having backside and frontside contacts and methods for forming such contacts.

With shrinking dimensions of various integrated circuit components, transistors such as field-effect transistors (FETs) have experienced dramatic improvements in both performance and power consumption. These improvements may be largely attributed to the reduction in dimensions of components used therein, which in general translate into reduced capacitance, resistance, and increased through-put current from the transistors. Metal oxide semiconductor field-effect transistors (MOSFETs) are well suited for use in high-density integrated circuits. As the size of MOSFETs and other devices decreases, the dimensions of source/drain regions, channel regions, and gate electrodes of the devices, also decrease.

FinFET, nanosheet and vertical transport FETs have been under development for possible use in tight pitch applications. Nanosheet FETs include multiple channel layers, each channel layer being separated by a gate stack including a layer of electrically conductive gate material and a gate dielectric layer. The gate stacks wrap around all sides of the channel layers, thereby forming a gate-all-around (GAA) structure. Epitaxial regions on the ends of the nanosheet channel layers form source/drain regions of the nanosheet FETs.

The use of both frontside contacts and backside contacts can facilitate the fabrication and performance of integrated circuits. By providing contacts on both sides of a chip, contact spacing can be greater than if only one side (for example, the front side) includes all contacts for the FETs. Backside power rails can be electrically connected to backside source/drain contacts.

BRIEF SUMMARY

An exemplary monolithic semiconductor structure includes a device layer having a front side and a back side, an interlevel dielectric layer, and a field-effect transistor within the interlevel dielectric layer that includes a channel region and first and second source/drain regions extending laterally from the channel region. Each of the first and second source/drain regions includes a top surface, a bottom surface, and side wall surfaces extending between the top surface and the bottom surface. The device layer further includes a first metal source/drain sidewall contact directly contacting the side wall surfaces of the first source/drain region and having a top end and a bottom end and a second metal source/drain sidewall contact directly contacting the side wall surfaces of the second source/drain region, the second metal source/drain sidewall contact also having a top end and a bottom end. A backside source/drain contact directly contacts the bottom surface of the first source/drain region and the bottom end of the first metal source/drain sidewall contact. A frontside source/drain contact directly contacts the top surface of the second source/drain region and the top end of the second metal source/drain sidewall contact. The backside and frontside source/drain contacts comprise metal.

A second monolithic semiconductor structure includes a device layer having a front side and a back side. The device layer includes field-effect transistors and an interlevel dielectric layer. The field-effect transistors are positioned within the interlevel dielectric layer. Each of the field-effect transistors includes a channel region and first and second source/drain regions extending laterally from the channel region. Each of the first and second source/drain regions includes a top surface, a bottom surface, and side wall surfaces extending between the top surface and the bottom surface. Metal source/drain sidewall contacts and adjoin, respectively, the side wall surfaces of the first and second source/drain regions of each of the field-effect transistors. Backside source/drain contacts extend from the back side of the device layer. Each of the backside source/drain contacts includes metal and directly contacts, respectively, the bottom surface of the first source/drain region of one of the field-effect transistors and the bottom end of one of the source/drain sidewall contacts on the side wall surfaces of the first source/drain region.

A method of fabricating a fabricating a monolithic semiconductor structure including a backside contact and a frontside contact is provided in accordance with a further aspect of the invention. The method includes obtaining a device layer including an interlevel dielectric layer and a field-effect transistor within the interlevel dielectric layer. The field-effect transistor includes a channel region and first and second source/drain regions extending laterally from the channel region, each of the first and second source/drain regions including a top surface, a bottom surface, and side wall surfaces extending between the top surface and the bottom surface. A first metal source/drain sidewall contact is formed directly on the side wall surfaces of the first source/drain region and a second metal source/drain sidewall contact is formed directly on the side wall surfaces of the second source/drain region. The first metal source/drain sidewall contact and the second metal source/drain sidewall contact each have a top end and a bottom end. The method further includes forming a frontside source/drain contact directly on the top surface of the second source/drain region and the top end of the second metal source/drain sidewall contact and forming a backside source/drain contact directly on the bottom surface of the first source/drain region and the bottom end of the first metal source/drain sidewall contact.

Techniques and structures as disclosed herein can provide substantial beneficial technical effects. By way of example only and without limitation, one or more embodiments may provide one or more of the following advantages:

Manufacturing flexibility;

Benefits of backside power delivery network technology;

Increased backside and frontside contact/silicide areas;

Wrap-around backside and frontside contacts.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 1 is a top plan view of a layout including sacrificial gates over nanosheet stacks, showing x and y cross sections according to an exemplary embodiment;

FIG. 1A is a schematic, cross-sectional view along the x cross section of FIG. 1;

FIG. 1B is a schematic, cross-sectional view thereof taken along the y cross section;

Figure 2B:
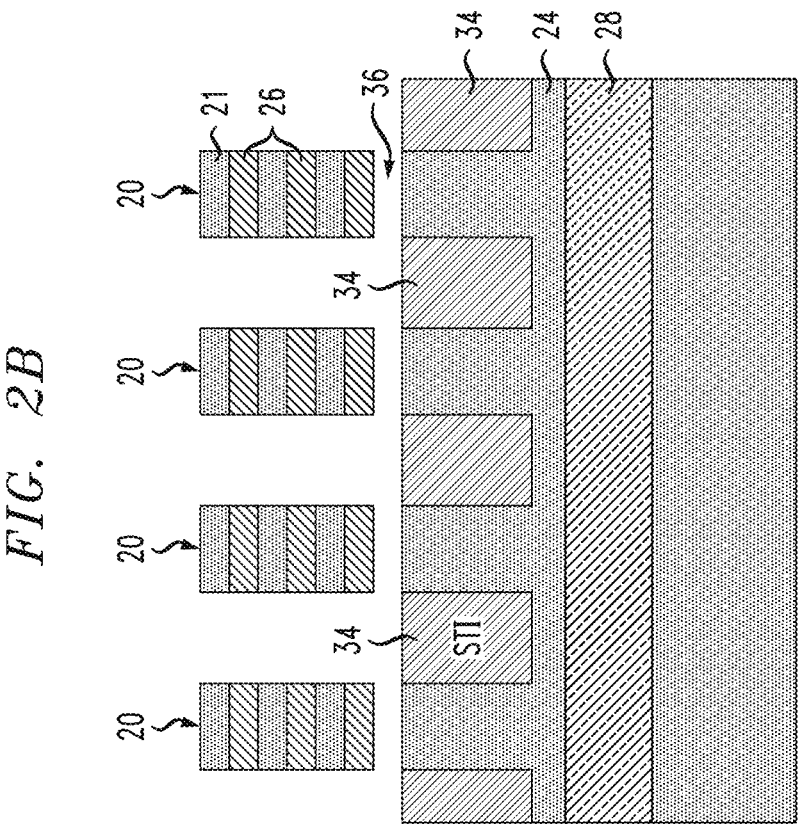
FIG. 2B is a schematic, cross-sectional view thereof taken along the y cross section.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

The use of backside contacts in addition to frontside contacts may facilitate the manufacture and performance of integrated circuits, particularly those including relatively small elements and increased packing density. Gate-all-around (GAA) transistors such as nanosheet transistors and fin-like field effect transistors (FinFETs) are among the elements employed in high density, high performance applications.

An exemplary sequence of steps that may be employed for the fabrication of integrated circuits including backside contacts is shown in FIG. 1 and subsequent figures. The schematic top plan view of FIG. 1 provides perspective of the orientations of x and y cross sections with respect to fins comprising nanosheet stacks 20 and sacrificial gates 22 extending perpendicularly with respect to the fins. It will be appreciated that techniques as described herein are applicable to architectures including FinFETs as well as those including nanosheet transistors.

The monolithic structure shown in FIG. 1, FIG. 1A, and FIG. 1B include stacks 20 of nanosheets including semiconductor channel layers 21 and sacrificial silicon germanium layers 26 formed over a substrate. The nanosheets can, for example, be formed on a bulk semiconductor substrate. Referring to FIG. 1A and FIG. 1B the substrate includes a silicon layer 24 and an etch stop layer 28 within the silicon substrate layer 24. The etch stop layer can be, for example, a buried oxide (BOX) layer or a silicon germanium layer.

In one or more exemplary embodiments, the semiconductor nanosheet (channel) layers 21 each have a thickness in the range of four to ten nanometers (4-10 nm). The number of semiconductor (channel) layers in the semiconductor layer stack may vary depending on the desired uses and capabilities of the nanosheet transistors to be fabricated. The semiconductor channel layers 21 are essentially monocrystalline silicon layers and are spaced ten to twenty nanometers (10-20 nm) apart in some embodiments. The width of each semiconductor channel layer 21 in the top, fin-like portions of the exemplary monolithic structure is fifteen nanometers (15 nm) or greater (as viewed in they cross sections) in some embodiments. The dimensions of the channel layers and the vertical spacing of channel layers should be considered exemplary as opposed to limiting.

Silicon and silicon germanium layers 21, 26, respectively, can be epitaxially grown on a semiconductor substrate in alternating sequence to obtain a layered stack having the desired number of silicon (channel) layers. The terms "epitaxially growing and/or depositing" and "epitaxially grown and/or deposited" mean the growth of a semiconductor material on a deposition surface of a semiconductor material in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

The monolithic structure illustrated in FIG. 1, FIG. 1A, and FIG. 1B is obtained by first growing silicon and silicon germanium nanosheet layers in alternating sequence on the substrate. The sacrificial silicon germanium layers 26, which are replaced by metal gate and gate dielectric materials later in the process, may have a thickness in the range of six to twenty nanometers (6-20 nm). The dimension ranges of the channel layers and sacrificial silicon germanium layers should be considered exemplary as opposed to limiting. The sacrificial silicon germanium layers 26 may have the composition $Si_{1-x}Ge_x$ where x is between 0.2 and 0.3 to allow selective etching with respect to silicon as well as the underlying silicon germanium substrate layer 26'. In one exemplary embodiment, the sacrificial silicon germanium layers 26 have the composition $Si_{1-x}Ge_x$ where x is about 0.3 while the silicon germanium substrate layer 26' has the composition $Si_{1-x}Ge_x$ where x is about 0.55. The thickness of the top silicon germanium substrate layer 26' may or may not be the same thickness as the sacrificial silicon germanium layers 26 that adjoin the silicon channel layers 21. Using a patterned hard mask (for example, silicon nitride), an initial reactive ion etch (RIE) is performed to obtain a multi-layer, fin-like semiconductor structure having a dielectric cap (not shown) formed from the hard mask. The multi-layer, fin-like semiconductor structures (nanosheet stacks 20) extend vertically from the semiconductor substrate 24, 26. The remaining portions of the hard mask are removed.

As shown in FIG. 1B, cavities are formed within the semiconductor substrate between nanosheet stacks 20. The cavity bottoms are above the top surface of the etch stop layer 28. Shallow trench isolation (STI) regions 34 are formed within the cavities in the substrate 24 to provide electrical isolation of active regions comprising neighboring transistors or other devices that may be formed on the substrate 24. Silicon dioxide or other suitable dielectric material may be deposited to form such regions.

A sacrificial gate layer is formed over the stacks 20 of nanosheet layers. The sacrificial gate layer may comprise, for example, a thin layer of SiO2 and amorphous silicon (a-Si) or polycrystalline silicon (polysilicon). Sacrificial gate material used to form the sacrificial gate layer may be formed using, for example, physical vapor deposition (PVD), chemical vapor deposition (CVD), plasma enhanced chemical vapor deposition (PECVD), inductively coupled plasma chemical vapor deposition (ICP CVD), or any combination thereof. A hard mask (for example, SiNx or a combination of SiNx and $SiO_2$)) is deposited and patterned on the top surface of the sacrificial gate layer. The sacrificial gate layer is then subjected to a reactive ion etch. The resulting structure includes sacrificial gates 22 that extend perpendicularly with respect to the parallel nanosheet stacks 20. The patterned gate hard mask 32 adjoins the top surfaces of the sacrificial gates. The sacrificial gates 22 extend through both nFET and pFET regions of the exemplary structure, as illustrated in FIG. 1.

Figure 2A:
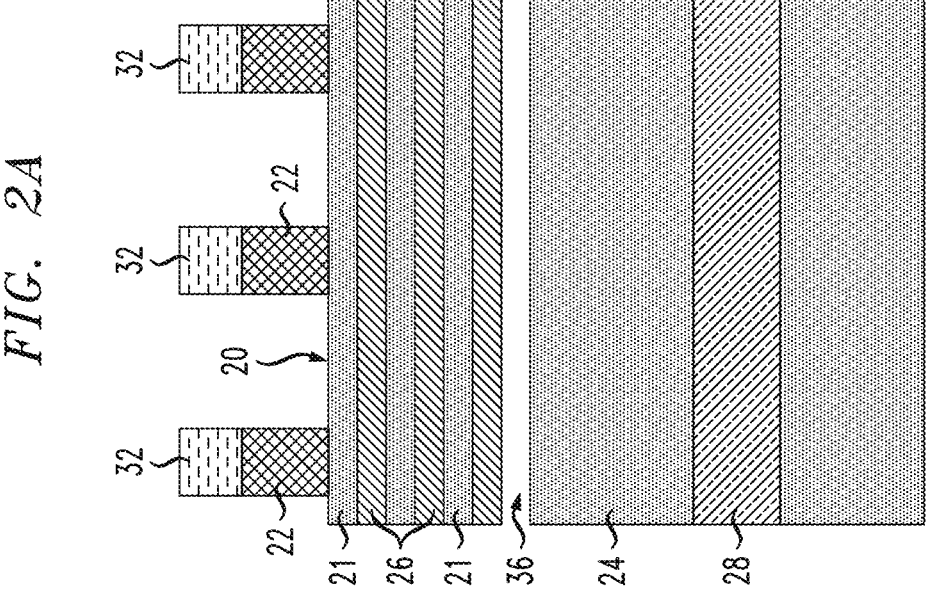
FIG. 2A is a schematic, cross-sectional view along the x cross section showing the structure depicted in FIG. 1A following removal of a bottom layer of the nanosheet stacks.

The top substrate layer 26' is selectively removed, thereby forming spaces 36 between the top surface of the semiconductor layer 24 and the nanosheet stacks 20. As discussed above, the top substrate layer 26' has a higher germanium content than the sacrificial silicon germanium layers 26 within the nanosheet stacks 20 and can therefore be etched selectively with respect to such layers. A selective etching process such as dry HCl etch can be employed to remove the top substrate layer 26' selective to the silicon channel layers 21 as well as the sacrificial silicon germanium layers 26. FIG. 2A and FIG. 2B provide sectional views in the x and y cross sections, respectively, of the resulting structure.

Figure 3B:
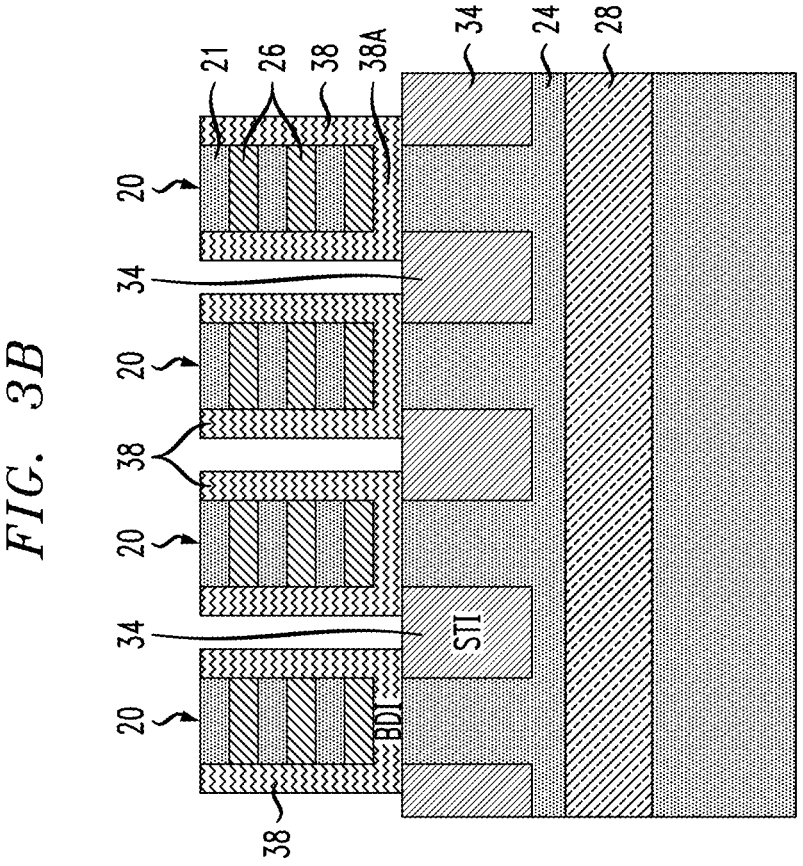
FIG. 3B is a schematic, cross-sectional view thereof, taken along the y cross section, of the structure shown in FIG. 3A.
Figure 3A:
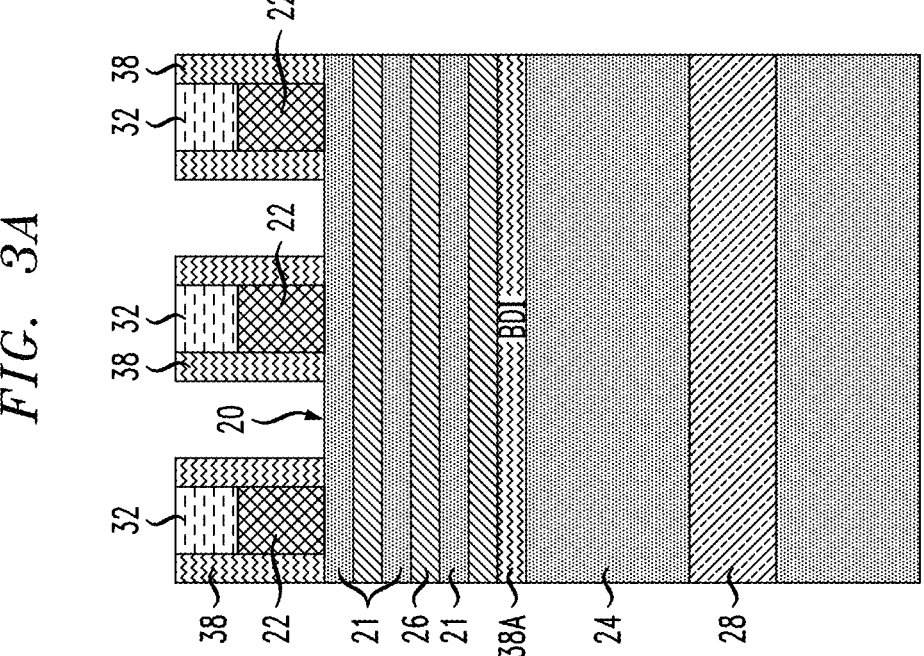
FIG. 3A is a schematic, cross-sectional view of the structure shown in FIG. 2A following formation of a spacer layer and a bottom dielectric isolation layer.

A dielectric layer is deposited over the resulting structure and fills the spaces 36 beneath the nanosheet stacks 20. Dielectric gate spacers may comprise, for example, SiN, SiBCN, SiOCN and/or SiCO, or other suitable dielectric materials. Such materials can be deposited using ALD (atomic layer deposition). In an exemplary embodiment, a silicon nitride liner is deposited on the monolithic structure. The silicon nitride liner is selectively etched back to remove unprotected horizontal portions thereof, thereby forming vertical, top sidewall gate spacers 38 on the sidewalls of the nanosheet stacks 20 and the sacrificial gates 22. The spacer material beneath the nanosheet stacks is protected and remains within the spaces 36 following etch-back, thereby forming a bottom dielectric isolation layer. FIG. 3A and FIG.

3B provide sectional views of the resulting structure including the vertical gate spacers 38 and the bottom dielectric isolation layer (horizontal spacers 38A) beneath the nanosheet stacks 20.

Figure 4B:
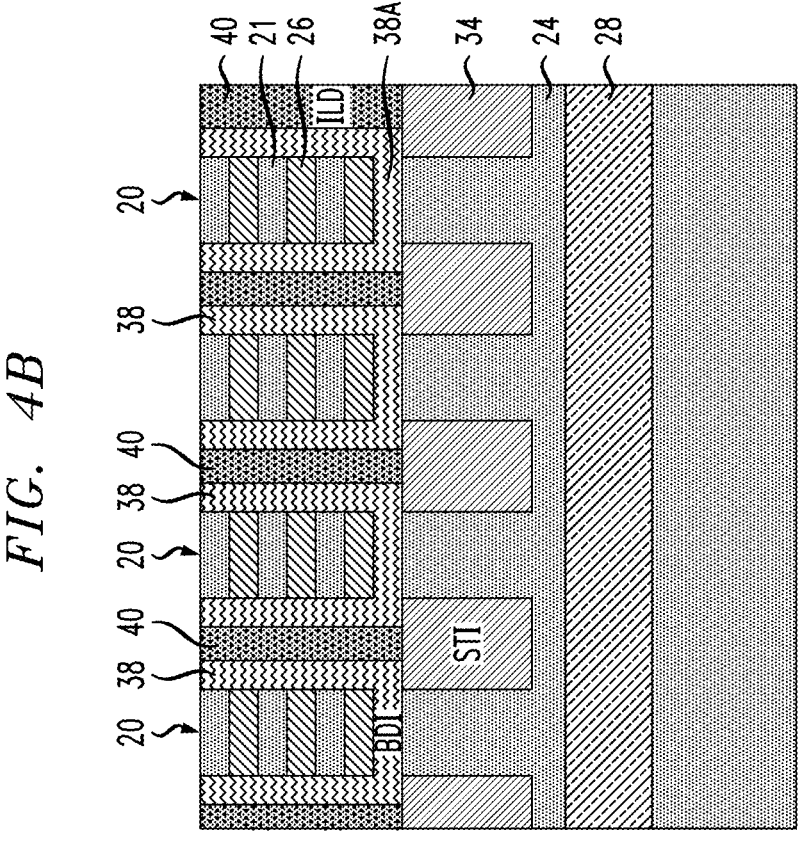
FIG. 4B is a schematic, cross-sectional view, taken along the y cross section.
Figure 4A:
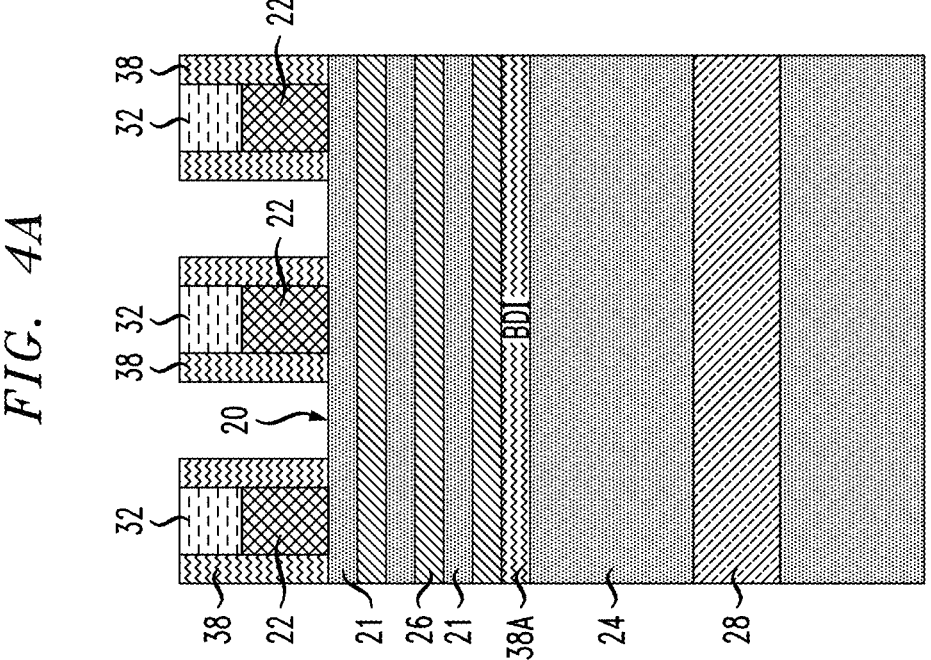
FIG. 4A is a schematic, cross-sectional view of the structure shown in FIG. 3A following deposition and recessing of an interlevel dielectric layer.

An interlevel dielectric (ILD) layer 40 is deposited over the structure using deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), spin-on coating, sputtering, and/or plating. The ILD layer 40 may include, but is not necessarily limited to, low-k materials (e.g., k less than about 4.0), such as, for example, porous silicates, carbon doped oxides, silicon dioxides, silicon oxynitrides, carbon-doped silicon oxide (SiCOH) and porous variants thereof, silsesquioxanes, siloxanes, or other dielectric materials having, for example, a dielectric constant in the range of about 2 to about 4. An SiCOH dielectric film having a dielectric constant (k) of about 2.7-2.8 can, for example, comprise one or more ILD layers. Such a dielectric film can be deposited using PECVD. ILD layers may, in some embodiments, comprise an ultra low-k (ULK) dielectric material having a dielectric constant of 2.5 or below. The ILD layer comprises multiple layers in some embodiments. The ILD layer 40 is recessed down to the top surfaces of the nanosheet stacks. As schematically illustrated in FIG. 4B, the ILD layer 40 fills the spaces between the gate spacers 38 and extends down to the top surfaces of the STI regions 34.

Figure 5B:
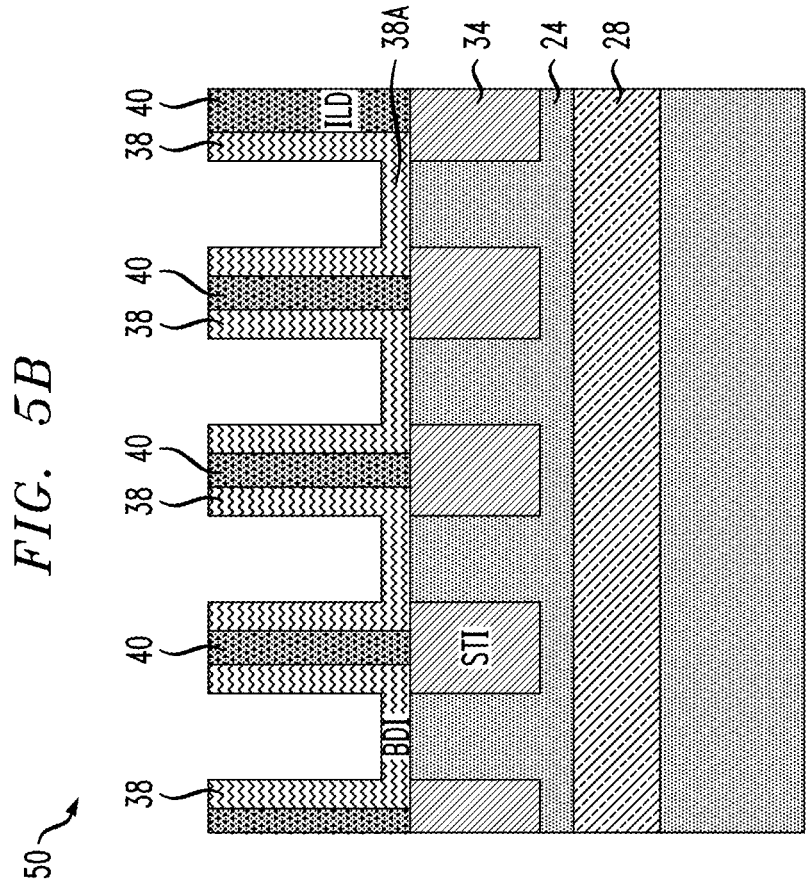
FIG. 5B is a schematic, cross-sectional view thereof, taken along the y cross section.
Figure 5A:
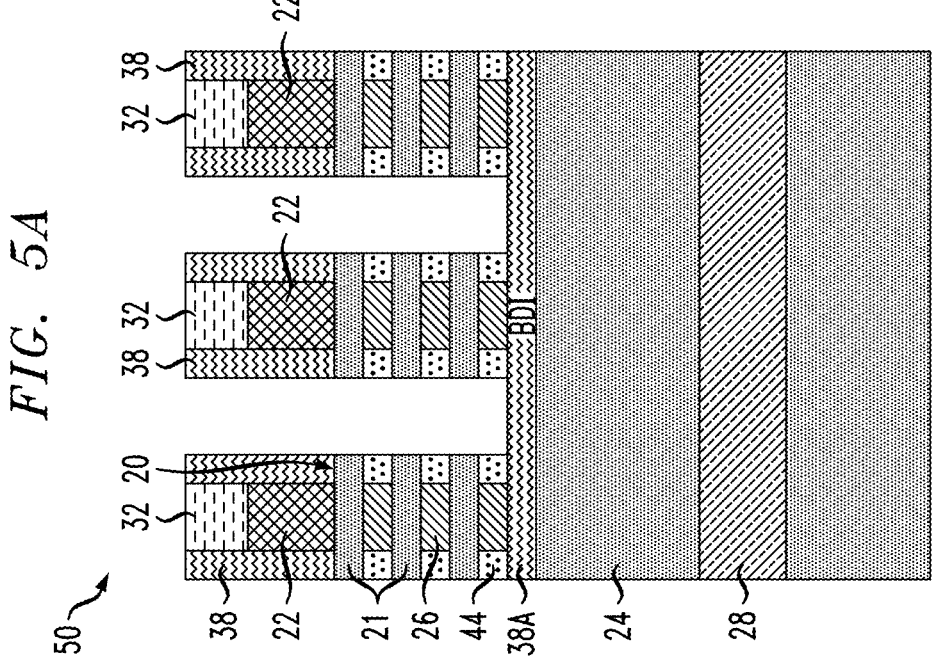
FIG. 5A is a schematic, cross-sectional view showing the structure of FIG. 4A following recessing of the nanosheet stacks and formation of inner spacers.

Referring to FIGS. 5A and 5B, the portions of the nanosheet stacks 20 outside the regions protected by the sacrificial gate 22, hard mask 32 and gate spacers 38 are subjected to a reactive ion etch down to the horizontal spacers 38A forming the bottom dielectric isolation (BDI) layer. The resulting structure is subjected to a timed wet etching process to selectively recess the silicon germanium layers 26 within the nanosheet stacks 20. Hydrogen chloride gas is employed in some embodiments to selectively remove silicon germanium, leaving the silicon nanosheet (channel) layers 21 substantially intact. Alternatively, a wet etch process containing ammonia and hydroperoxide can be used to etch SiGe selective to other materials. Each exposed end of the silicon germanium layers 26 may be recessed by, for example, three to seven nanometers (3-7 nm). The silicon germanium layers 26 have smaller widths than the widths of the silicon (channel) layers 21 following the timed etch. The stack of semiconductor nanosheet layers accordingly includes indents between the end portions of each pair of silicon (channel) layers 21.

Dielectric spacer material is deposited in the trenches resulting from the reactive ion etch of the stack of semiconductor layers. The dielectric spacer material is etched back to form inner spacers 44 within each of the indents in the stack of nanosheet semiconductor layers. A selective wet etch may be employed to remove the dielectric inner spacer material outside of the indents between silicon layers. A structure 50 as schematically illustrated in FIGS. 5A and 5B may be obtained. The inner spacers 44 of the structure may comprise, for example, low-k dielectric material. Silicon oxynitride, SiBCN (silicon borocarbonitride), SiOCN (silicon oxycarbonitride), and/or SiOC (silicon oxycarbide) inner spacers may be formed in some embodiments. Relatively low-k silicon nitride-based materials, if used to form the inner spacers, can be selectively etched using, for example, phosphoric acid. Various techniques of forming inner spacers for nanosheet transistors have been discussed in the literature and continue to be developed. The particular materials and steps discussed with respect to inner spacer formation should accordingly be considered exemplary as opposed to limiting.

Figure 6B:
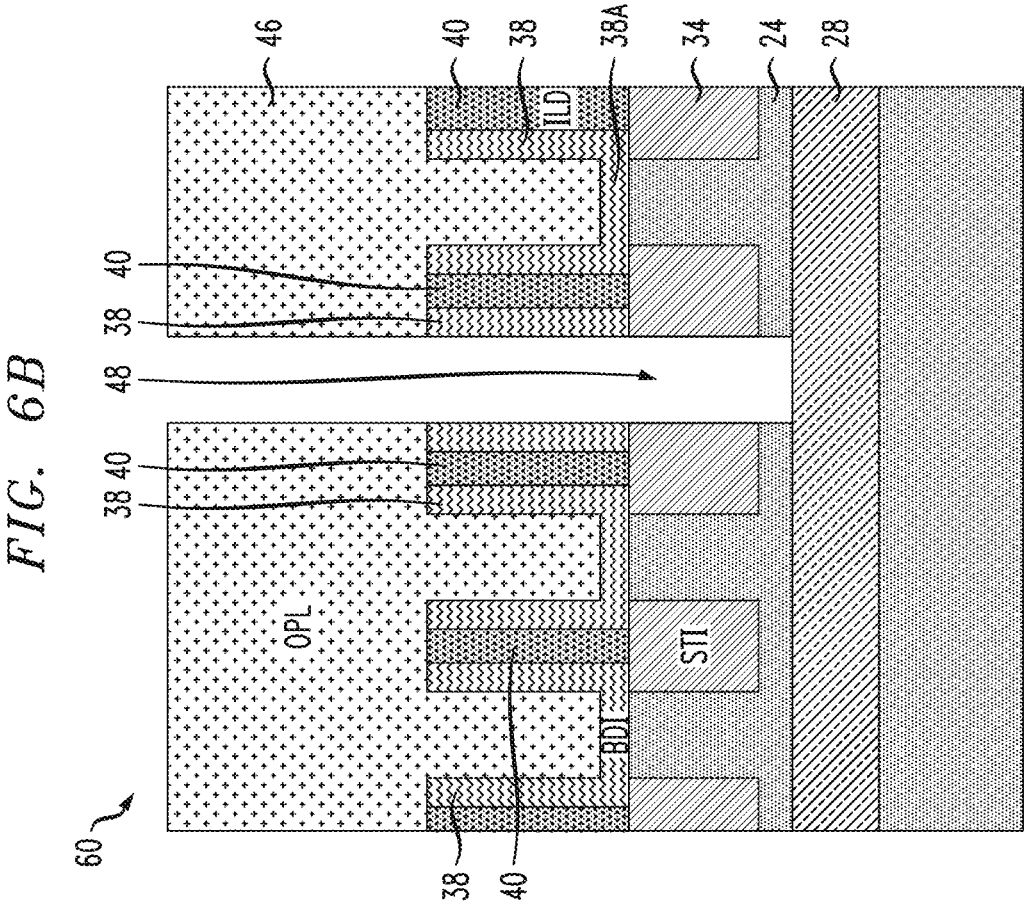
FIG. 6B is a schematic, cross-sectional view thereof, taken along the y cross section.
Figure 6A:
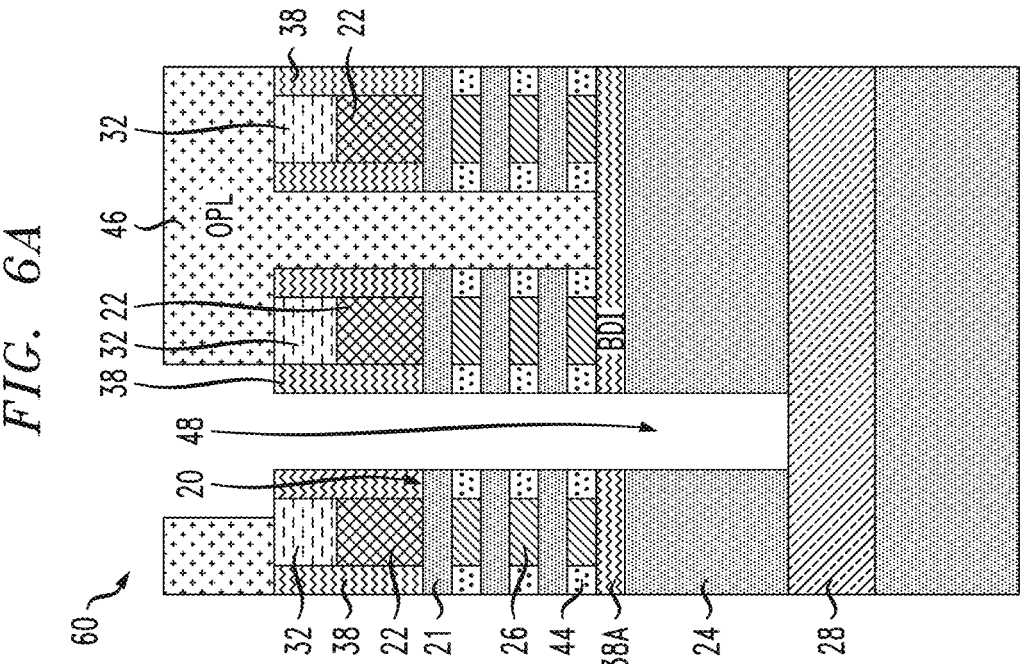
FIG. 6A is a schematic, cross-sectional view of the structure shown in FIG. 5A following backside contact patterning.
Figure 7B:
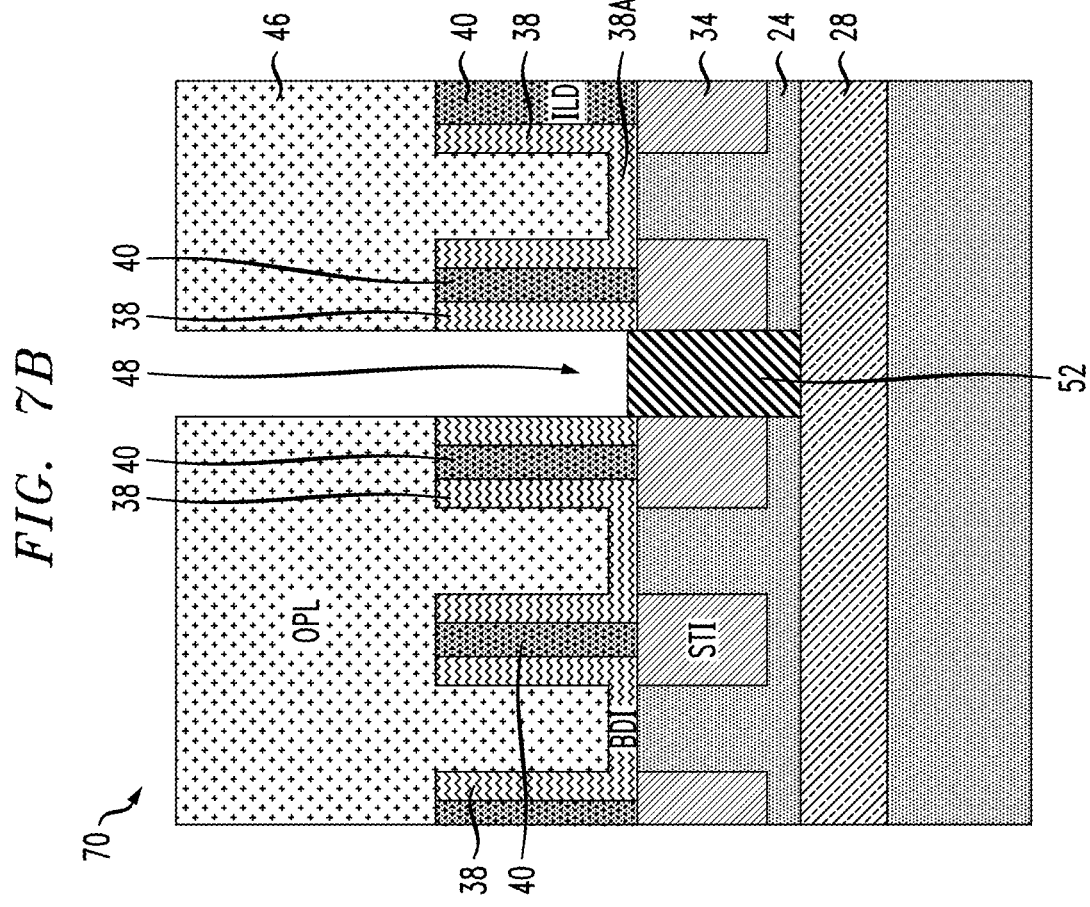
FIG. 7B is a schematic, cross-sectional view thereof taken along the y cross section.
Figure 7A:
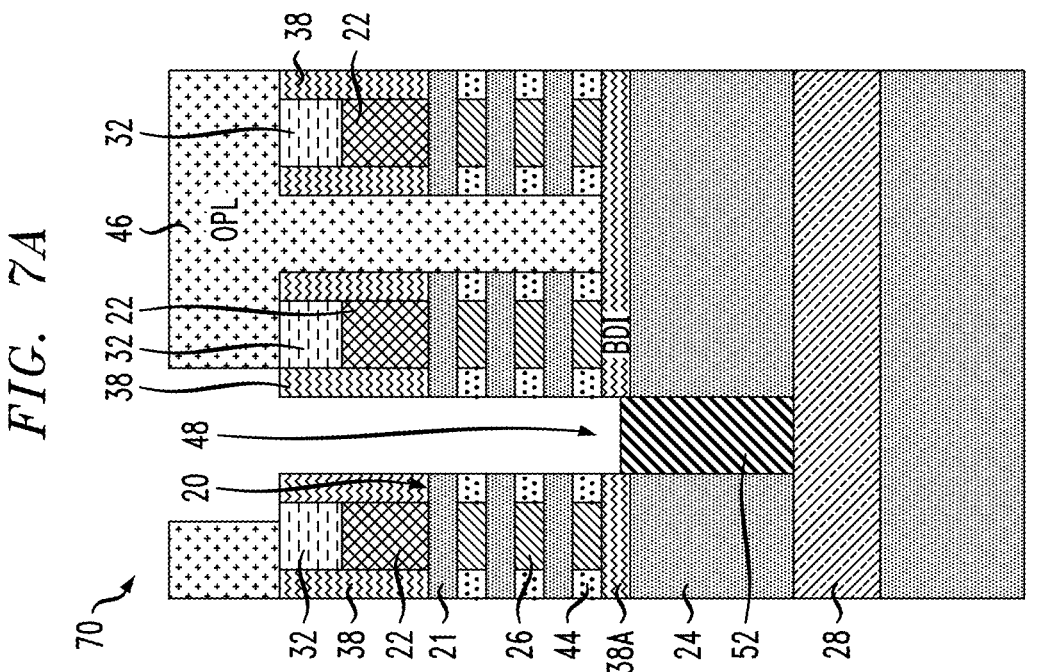
FIG. 7A is a schematic, cross-sectional view of the structure shown in FIG. 6A following formation of sacrificial placeholders for backside contacts.

An organic planarization layer (OPL) 46 is deposited and then patterned to obtain a structure 60 as illustrated in FIG. 6A and FIG. 6B. A lithographically patterned hard mask (not shown) may be employed to form vertical placeholder trenches 48 extending through the OPL 46 down to the etch stop layer 28 within the substrate. As shown in FIG. 6B, each trench 48 extends between a pair of STI regions 34. A placeholder material layer is deposited in the placeholder trenches 48. The placeholder material layer is recessed to form a structure 70 as schematically illustrated in FIG. 7A and FIG. 7B. The placeholder material layer comprises sacrificial placeholders 52 within the substrate that are later replaced by metal backside contacts, as described below. The sidewalls of the sacrificial placeholders 52 are substantially vertical. The bottom surfaces of the sacrificial placeholders adjoin the etch stop layer 28. The top surfaces of the sacrificial placeholders may extend above the bottom surface of the BDI layer 38A but below the level of the bottoms of the nanosheet stacks 20. Silicon carbide, aluminum oxide and titanium oxide are among the materials that may comprise the sacrificial placeholders 52.

Figure 8B:
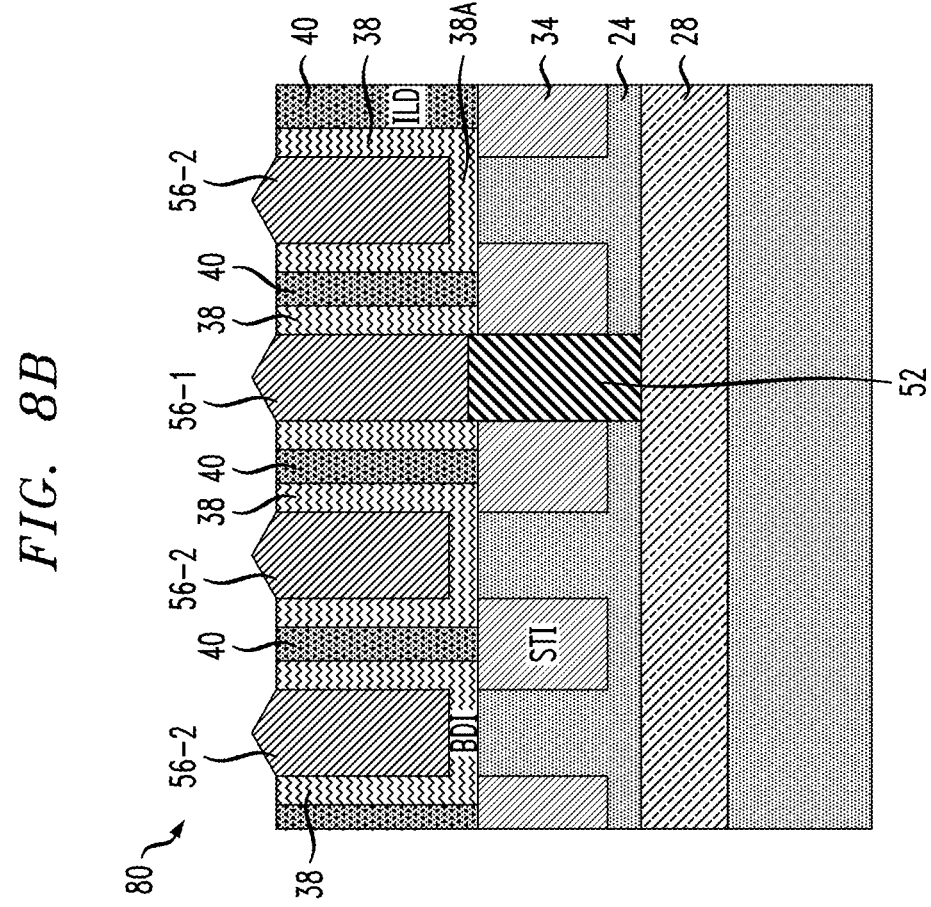
FIG. 8B is a schematic, cross-sectional view thereof, taken along the y cross section.
Figure 8A:
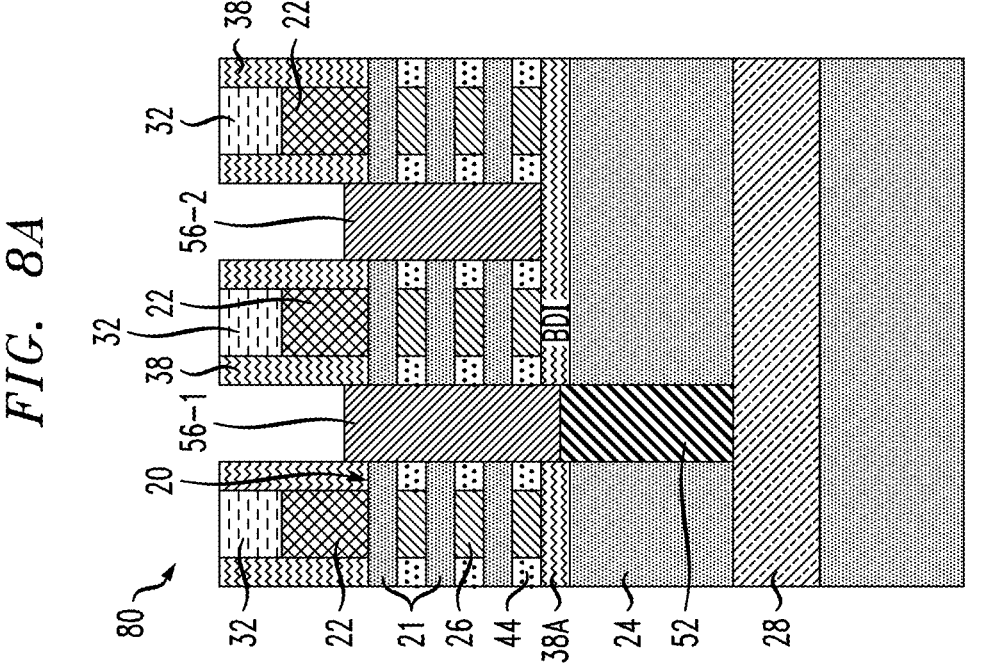
FIG. 8A is a schematic, cross-sectional view of the structure shown in FIG. 7A following formation of source/drain regions.

The OPL 46 is removed to expose further end portions of the channel nanosheet layers 21 of the nanosheet stacks 20. Ashing or other suitable process can be employed to remove the OPL. Source/drain regions 56-1, 56-2 are epitaxially grown on the exposed edges of the silicon nanosheet channel layers 21. Selected source/drain regions 56-1 are grown directly over sacrificial placeholders 52. Other source/drain region 56-2 grown over the BDI layer 38A, as shown in the exemplary structure 80 depicted in FIG. 8A and FIG. 8B. The epitaxial growth of the source/drain regions 56-1, 56-2 is timed to control height and width dimensions. Dopants may be incorporated in situ using appropriate precursors, as known in the art. By "in-situ" it is meant that the dopant that dictates the conductivity type of a doped layer is introduced during the process step, for example epitaxial deposition, that forms the doped layer. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. In a silicon-containing substrate, examples of n-type dopants, i.e., impurities, include but are not limited to antimony, arsenic and phosphorous. Exemplary epitaxial growth processes that are suitable for use in forming silicon and/or silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). With reference to FIG. 1, an nFET region(s) includes transistors having n-type source/drain regions while the pFET region(s) includes p-type source/drain regions. Source/drain regions of nanosheet devices are typically grown prior to the RMG process.

Figure 9B:
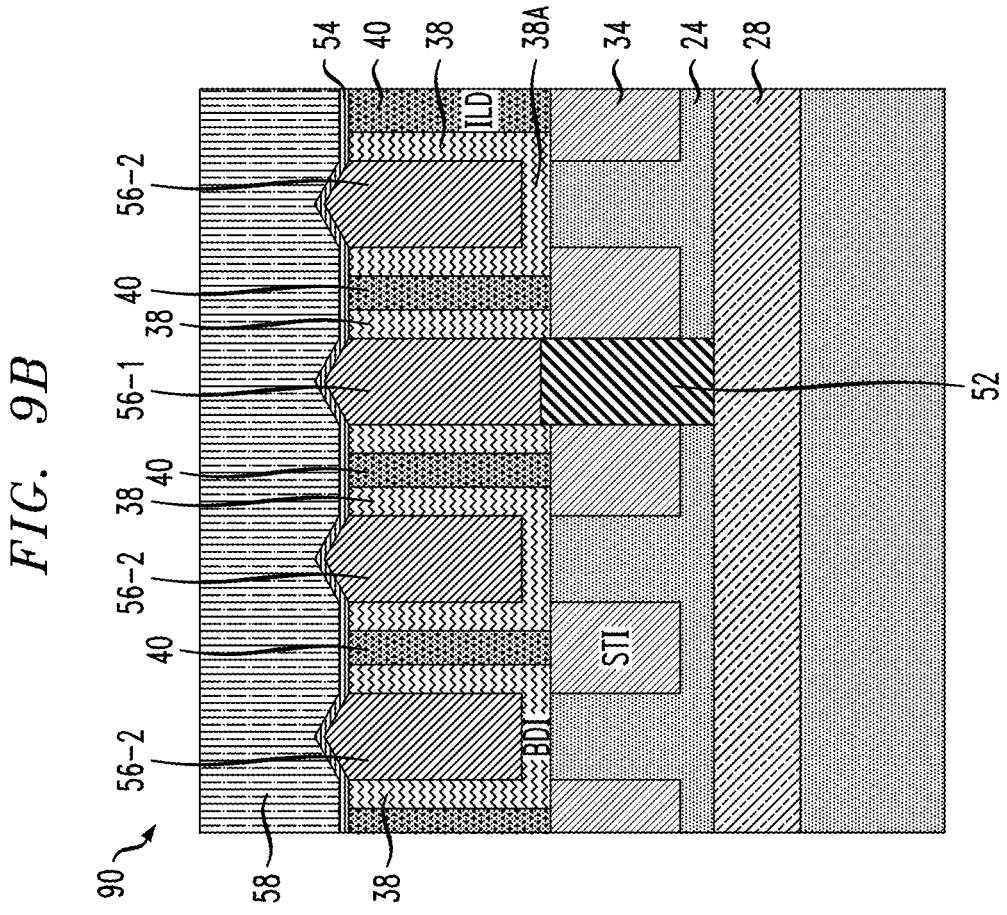
FIG. 9B is a schematic, cross-sectional view thereof taken along the y cross section.
Figure 9A:
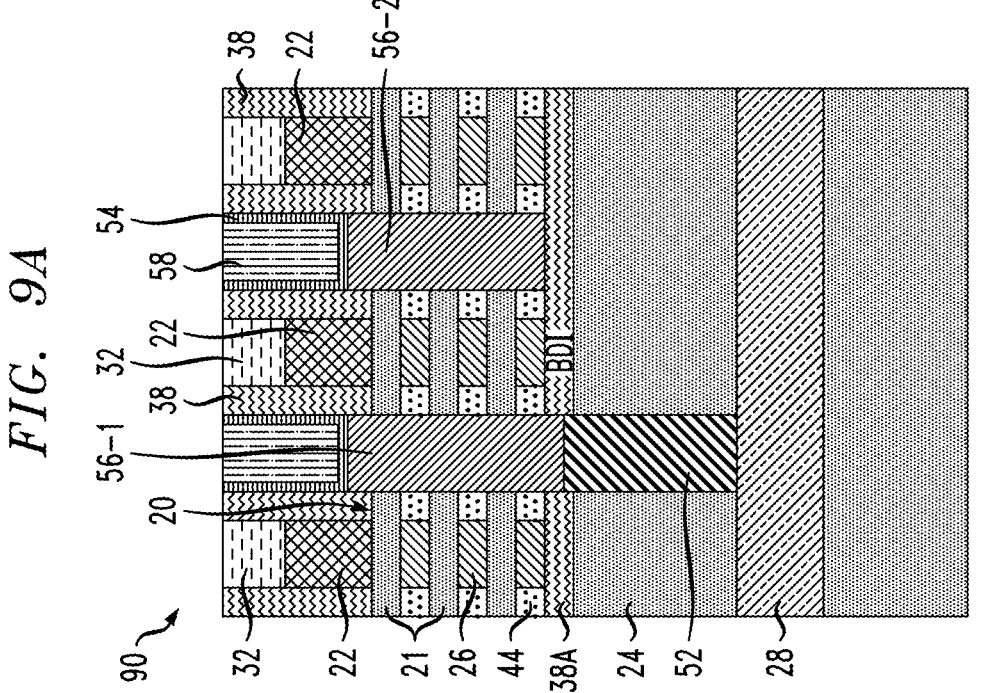
FIG. 9A is a schematic, cross-sectional view of the structure shown in FIG. 8A, taken along the x cross section, following formation of a dielectric liner deposition of dielectric fill material.

Referring to FIG. 9A and FIG. 9B, a dielectric liner 54 such as a silicon nitride liner is conformally deposited over the source/drain regions 56-1, 56-2, the ILD layer 40, and the spacers 38. A dielectric fill layer 58 is then deposited over the dielectric liner 54 and planarized down to the top surfaces of the hard mask 32. Planarization may be performed using a chemical mechanical planarization (CMP) process. The dielectric fill layer 58 may, for example, be a silicon dioxide layer. A monolithic structure 90 as illustrated in FIG. 9A and FIG. 9B may be obtained.

The hard mask 32 and sacrificial gate layer 22 are removed from the structure 90. The silicon germanium layers 26 are then selectively removed, leaving stacks of silicon (channel) layers 21 separated by spaces (not shown). Hydrogen chloride gas is employed in some embodiments to selectively remove silicon germanium, leaving silicon nanosheets substantially intact. Alternatively, a wet etch process containing ammonia and hydroperoxide can be used to etch SiGe selective to other materials. Gate stacks 62 are formed in adjoining relation to the nanosheet (channel) layers 21. A gate dielectric layer forms portions of the gate stacks that replace the sacrificial silicon germanium layers. The gate stacks adjoin the silicon nanosheet channel layers 21. Non-limiting examples of suitable materials for the gate dielectric layer include oxides, nitrides, oxynitrides, silicates (e.g., metal silicates), aluminates, titanates, nitrides, or any combination thereof. Examples of high-k gate dielectric materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material may vary depending on the deposition process as well as the composition and number of high-k dielectric materials used. In one exemplary embodiment, a high-k dielectric layer having a thickness of 2.5 nm is employed. In some embodiments, the gate dielectric layer includes multiple dielectric layers.

Electrically conductive gate material is deposited in the spaces formerly filled by the sacrificial gate 22 and the silicon germanium nanosheet layers 26. The deposited metal gate material forms the metal gate of the nanosheet field-effect transistors of the resulting structure 100. In some embodiments, the electrically conductive gate includes a work function metal (WFM) layer. WFM serves dual purposes: Vt setting and gate conductor. Non-limiting examples of suitable work function metals include p-type work function metal materials and n-type work function metal materials. P-type work function materials include compositions such as ruthenium, palladium, platinum, cobalt, nickel, and conductive metal oxides, titanium nitride, or any combination thereof. N-type metal materials include, for example, hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, a conformal ALD process.

In one exemplary embodiment, an n-type WFM layer having a thickness of three nanometers (3 nm) may be formed on the gate dielectric layer. The thickness of the WFM layer may, for example, be in the range of two to ten nanometers (2-10 nm), with thinner layers being used as device scaling decreases. The n-type WFM layer is intended for use in association with the n-type transistors. Portions of the n-type WFM layer that may also be deposited in the pFET region may accordingly be replaced later in the process. The n-type WFM layer and the gate dielectric may fill the spaces between the silicon channel layers 21 and the regions formerly occupied by the sacrificial gates 22.

Figure 10B:
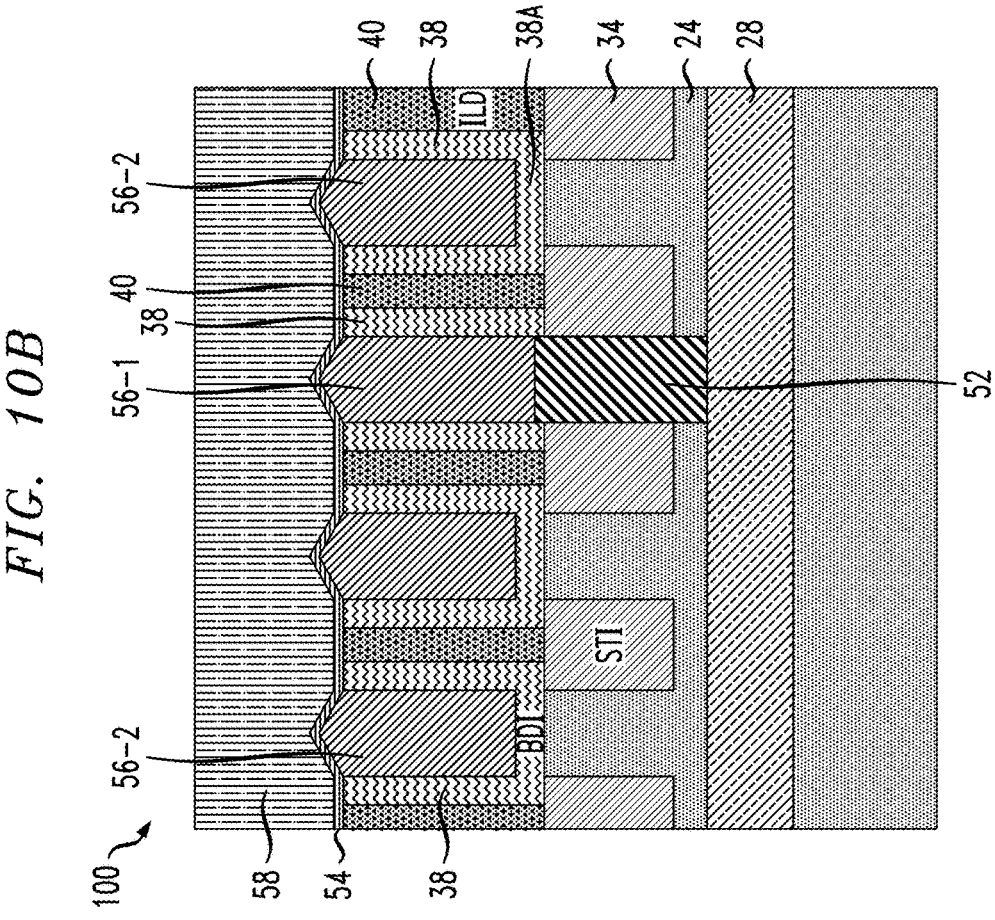
FIG. 10B is a schematic, cross-sectional view thereof, taken along the y cross section.
Figure 10A:
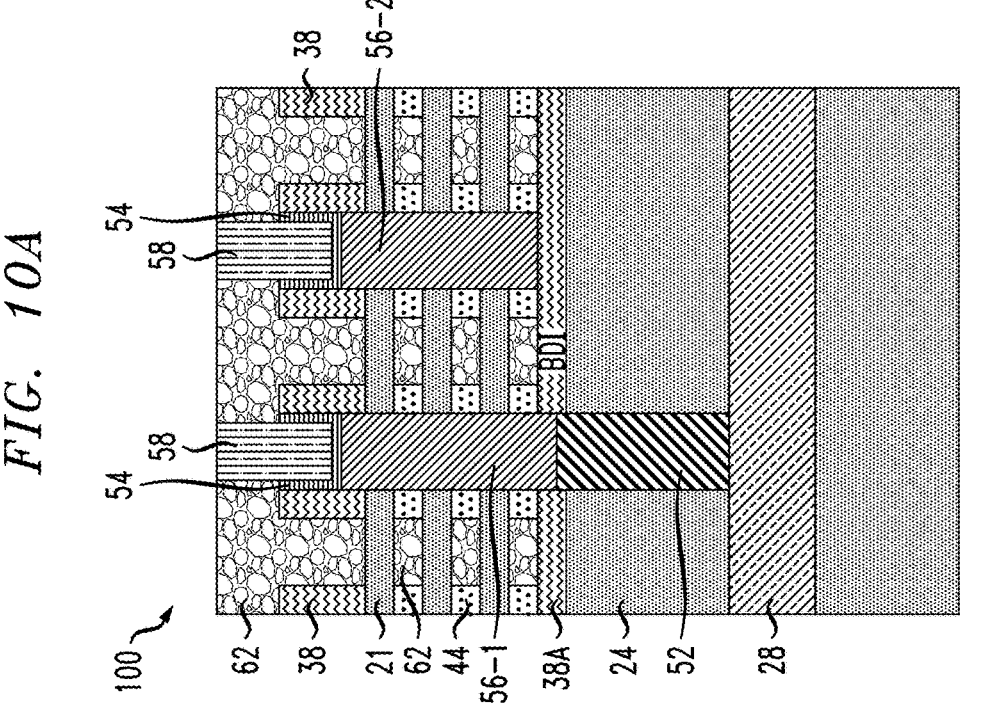
FIG. 10A is a schematic, cross-sectional view of the structure shown in FIG. 9A following replacement metal gate (RMG) processing.

The n-type WFM layer in the nFET region may be protected by the patterned OPL (not shown). Exposed portions of the n-type WFM layer in the pFET region is removed, leaving open spaces between the silicon channel layers 21 within the pFET region. Gate metal is accordingly removed from the pFET region while the protected nFET region remains intact. An SC1 etch or other suitable etch processes can be employed to selectively remove gate metal while leaving the gate dielectric layer substantially intact. The duration of the etch, which is sufficient to allow removal of all gate metal from the pFET region, does not affect the gate metal in the nFET region. Following removal of the originally deposited n-type WFM layer from the pFET region, new gate metal deemed appropriate for the pFET transistors is deposited. A p-type WFM layer is deposited in embodiments wherein the first-deposited metal is n-type. It will be appreciated that the process can be reversed and n-type metal can be deposited subsequent to p-type metal in some alternative embodiments. Metal overburden can be removed using chemical mechanical planarization. An FEOL layer comprising FETs and possibly other electronic devices (not shown) within an ILD layer 40 is accordingly provided. FIG. 10A and FIG. 10B provide sectional views of an exemplary structure 100.

Figure 11B:
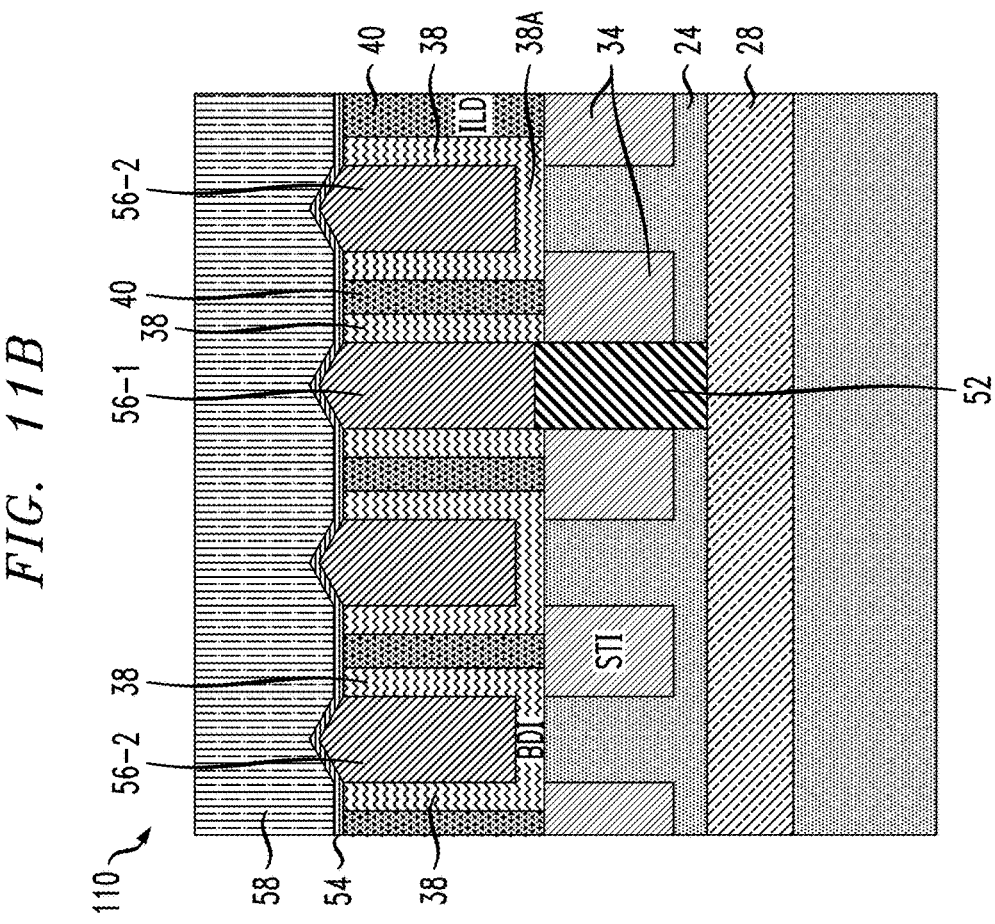
FIG. 11B is a schematic, cross-sectional view thereof taken along the y cross section.
Figure 11A:
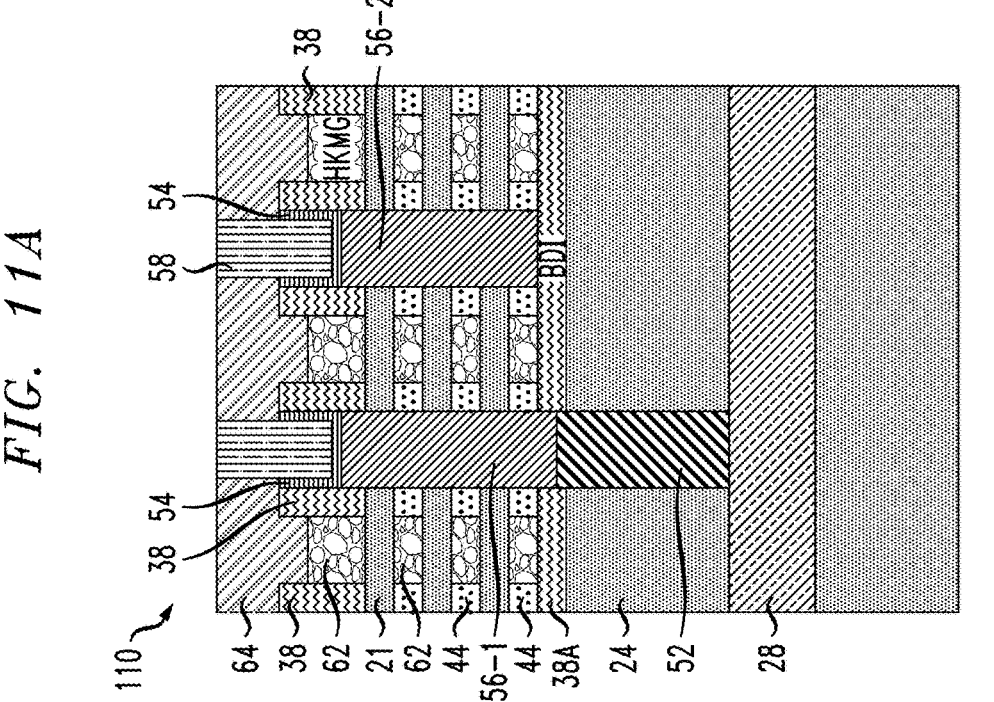
FIG. 11A is a schematic, cross-sectional view of the structure shown in FIG. 10A, following metal gate recess and formation of a dielectric gate cap layer.

The gate stack 62 is recessed and a self-aligned contact dielectric gate cap (SAC cap) layer 64 is formed on the structure. The dielectric gate cap layer is planarized down to the top surfaces of the dielectric fill layer 58. The composition of the dielectric gate cap layer 64 is different from the composition of the gate spacers 38. For example, a silicon carbide (SiC) gate cap layer 64 is formed in some exemplary embodiments. FIG. 11A and FIG. 11B illustrate an exemplary structure 110 obtained following gate stack recessing and gate cap layer formation.

Figure 12B:
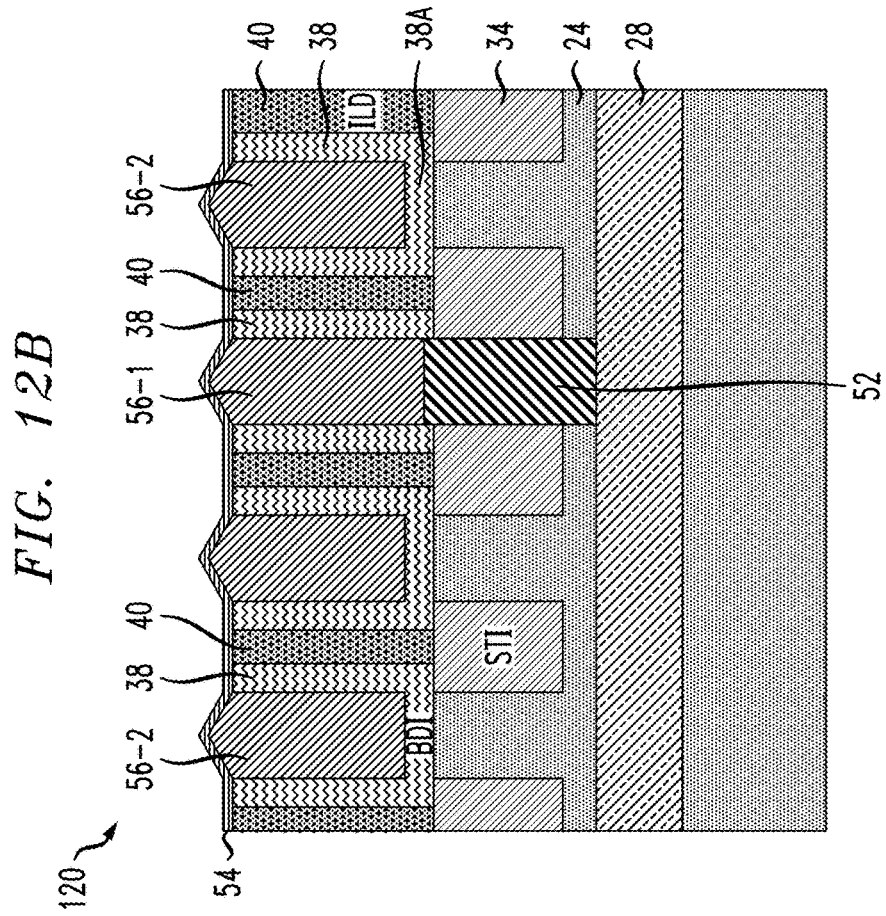
FIG. 12B is a schematic, cross-sectional view thereof taken along the y cross section.
Figure 12A:
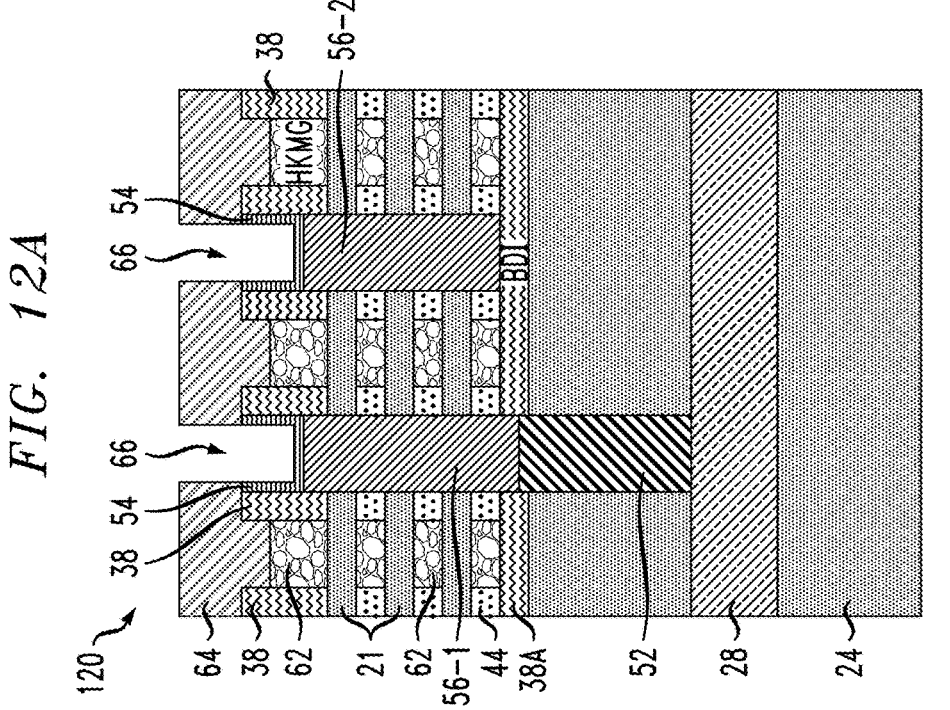
FIG. 12A is a schematic, cross-sectional view of the structure shown in FIG. 11A following recessing of the dielectric fill material.
Figure 13B:
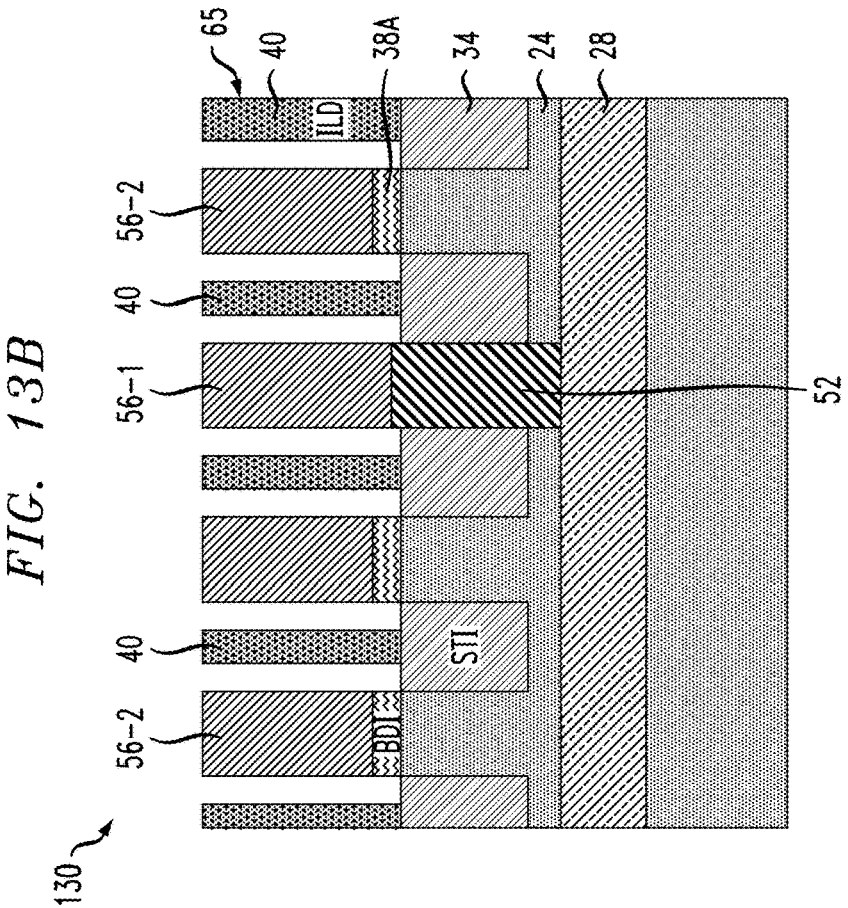
FIG. 13B is a schematic, cross-sectional view thereof taken along the y cross section.
Figure 13A:
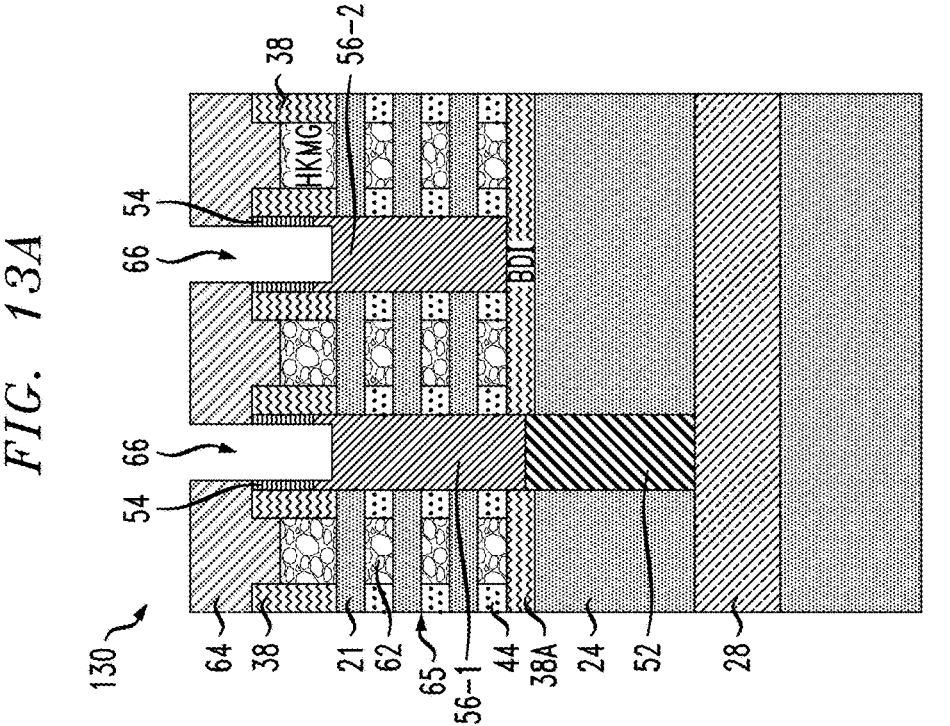
FIG. 13A is a schematic, cross-sectional view of the structure shown in FIG. 12A following selective removal of portions of the dielectric liner.

The dielectric fill layer 58 is recessed, stopping on the dielectric liner 54. Recesses 66 between portions of the gate cap layer 64, as shown in FIG. 12A. A structure 120 as illustrated in FIG. 12A and FIG. 12B may be obtained. The horizontal portions of the dielectric liner 54 are removed selectively with respect to the gate cap layer 64 and the source/drain regions 56-1, 56-2. As shown in the x cross section depicted in FIG. 13A, the vertical portions of the dielectric liner 54 remain. A reactive ion etch may be employed to remove the horizontal portions of the dielectric liner, thereby exposing top surfaces of the source/drain regions 56-1, 56-2. Unprotected portions of the gate spacers 38 are also selectively removed down to the STI regions 34, thereby exposing sidewall surfaces of the source/drain regions, as shown in FIG. 13B. The top portions of the source/drain regions may also be removed at this time as the spacer pull down process may not be perfectly selective to the source/drain epitaxy. The resulting structure 130 includes vertical spaces between the sidewalls of the source/drain regions and sidewalls of adjoining portions of the ILD layer 40. The vertical spaces extend through the device layer 65, the top ends thereof being open and the bottom ends thereof adjoining STI regions 34.

Figure 14B:
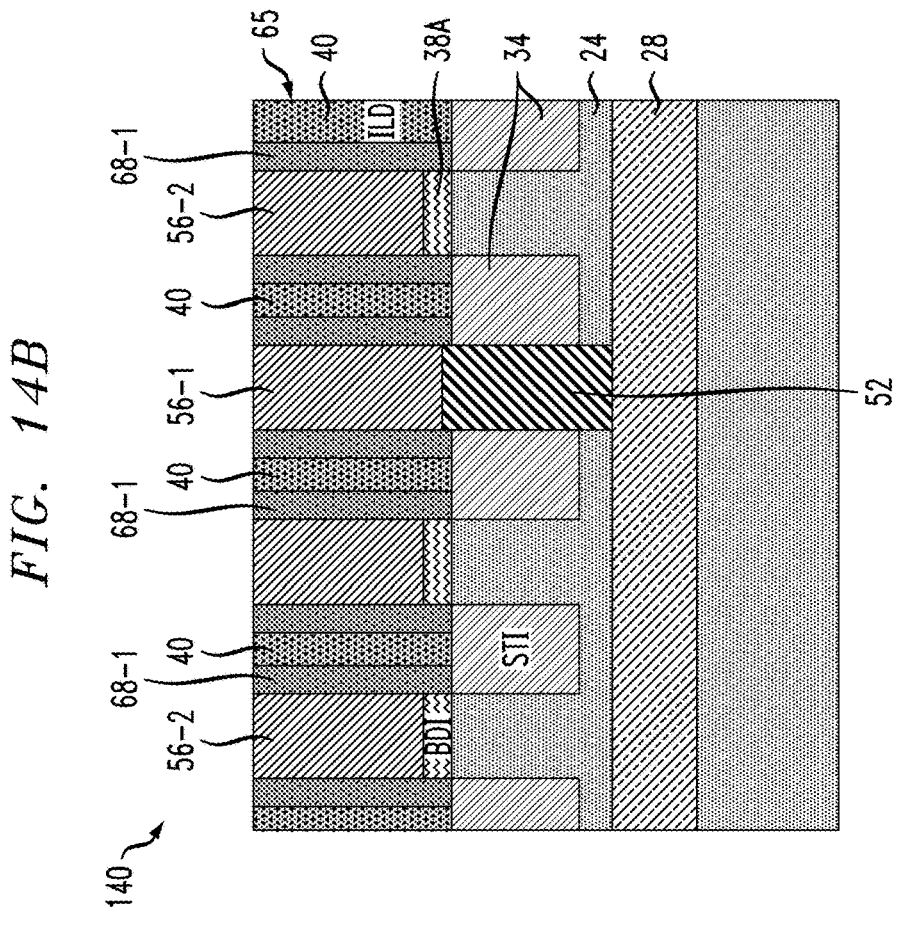
FIG. 14B is a schematic, cross-sectional view of the structure shown in FIG. 14A taken along the y cross section.
Figure 14A:
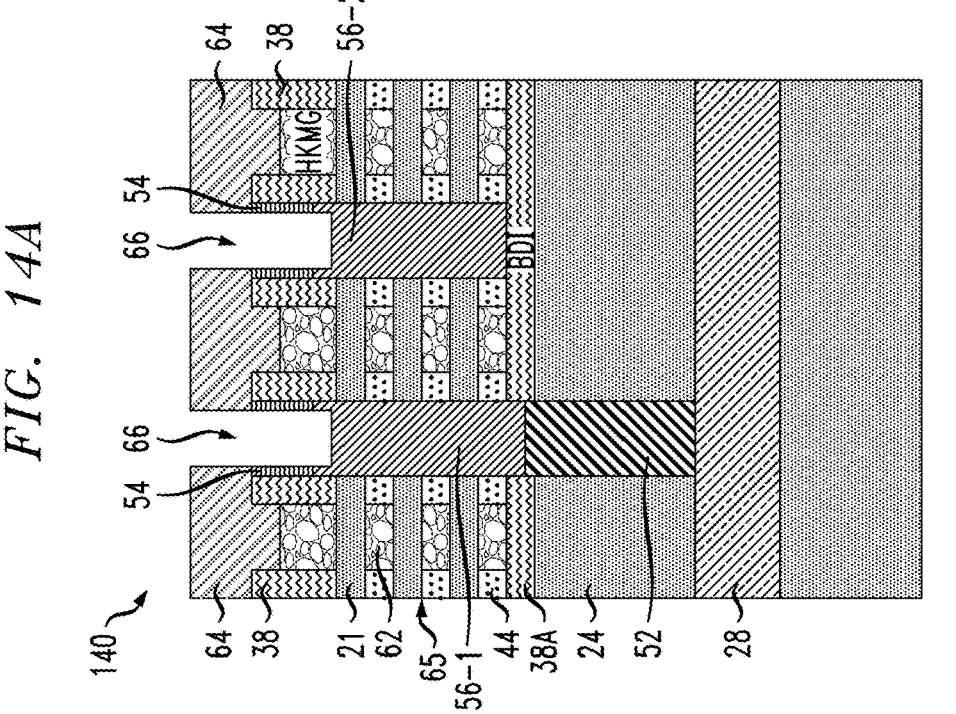
FIG. 14A is a schematic, cross-sectional view of the structure shown in FIG. 13A following formation of metal sidewall contacts adjoining the source/drain regions.

Metal sidewall source/drain contacts 68-1 are formed in the vertical spaces between the source/drain regions 56-1, 56-2 and the ILD layer 40. In some embodiments, titanium (Ti) is deposited using an atomic layer deposition (ALD) process to fill the vertical spaces. Other metals or electrically conductive compositions or combinations thereof may alternatively be deposited, such as nickel (Ni), nickel platinum (NiPt) or Ti/TiN, during sidewall metallization. An isotropic etch-back process can be employed to obtain a structure 140 as shown in FIG. 14A and FIG. 14B. The structure may be annealed to form a metal silicide layer between the contact metal and the source/drain epitaxy. The source/drain sidewall contacts 68-1 are incorporated within the device layer 65 and extend between the top surface of the ILD layer 40 and the bottom surface thereof. As further shown in FIG. 14B, the source/drain sidewall contacts extend through openings in the BDI layer 38A and have bottom ends adjoining STI regions 34. Each sidewall source/drain contact 68-1 forms an electrical connection to one of the source/drain regions 56-1, 56-2. As shown in FIG. 14B, the opposite side wall surfaces of the source/drain regions 56-1, 56-2, as viewed in the y cross section, are in direct contact with sidewall contact metal. The sidewall contacts 68-1 on each source/drain region are electrically isolated from the sidewall contacts of adjoining source/drain regions by portions of the ILD layer 40 and the STI regions 34.

Figure 15B:
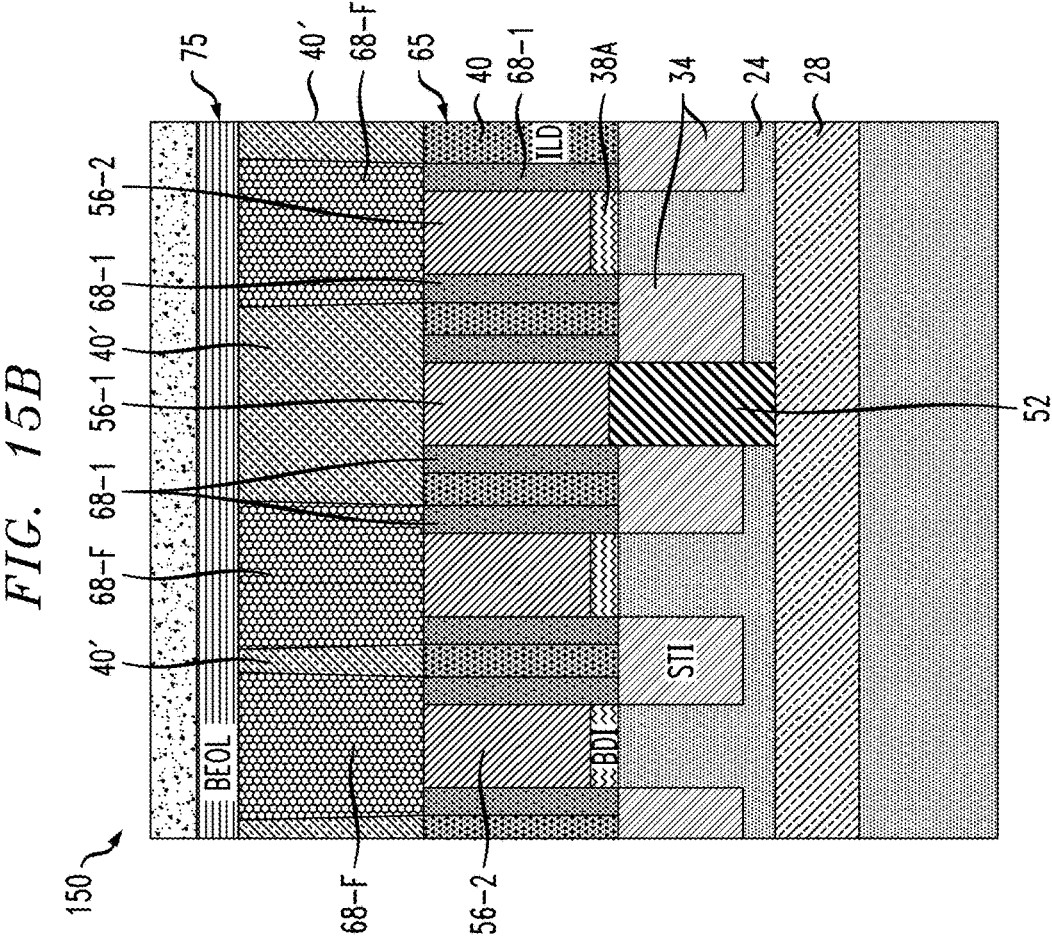
FIG. 15B is a schematic, cross-sectional view thereof taken along the y cross section.
Figure 15A:
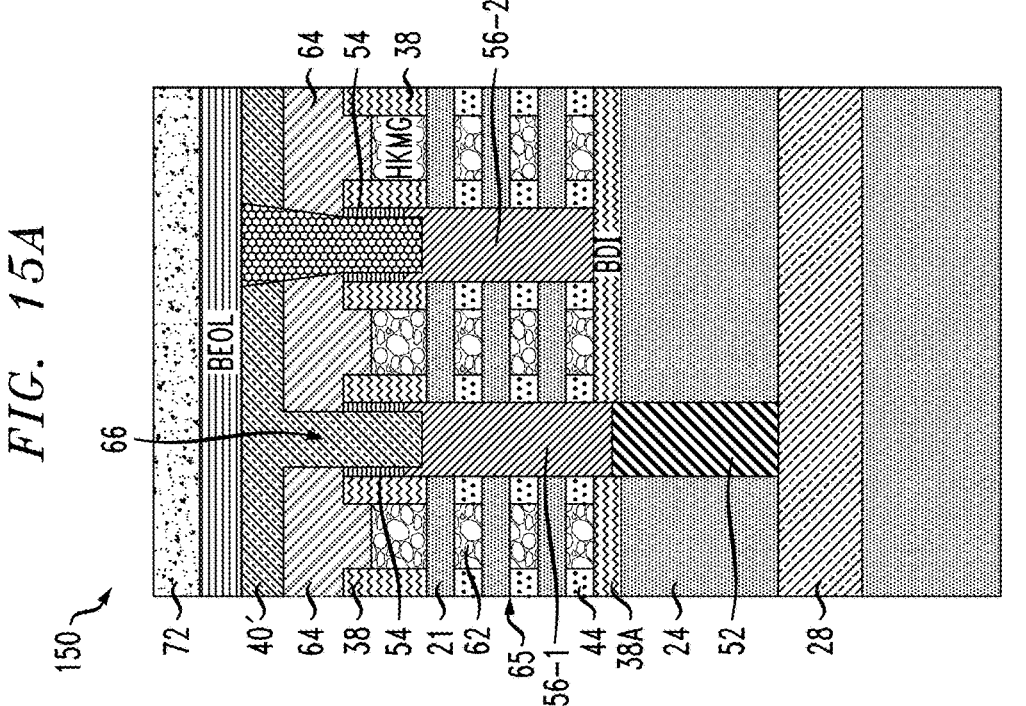
FIG. 15A is a schematic, cross-sectional view of the structure shown in FIG. 14A following middle-of-line metal contact formation, formation of a back-end-of-line interconnect layer, and bonding of a carrier wafer.

Referring to FIG. 15A and FIG. 15B, front side contacts are formed in middle-of-line (MOL) processing. Silicon-based devices typically include multiple interconnect metallization layers above a device (front-end-of-line/FEOL) layer 65 that contains field-effect transistors (FETs) and/or other electronic structures. FEOL processing includes high-temperature steps for manipulating semiconductor conductivity. Middle-of-line (MOL) processing includes steps typically used for fabricating metal contacts for logic circuitry components such as field-effect transistors (FETs), resistors, diodes, and capacitors. MOL processing may include intermediate-temperature steps for forming semiconductor-metal compounds (for example, silicides, germanosilicides) for electrical contacts. Back-end-of-line (BEOL) processing involves the creation of metal interconnecting wires that connect the devices formed in FEOL processing to form electrical circuits and may include silicidation as discussed above with respect to MOL processing.

A MOL ILD layer 40' is deposited over the device layer and patterned. Openings within the MOL ILD layer extend down to the top surfaces of selected source/drain regions 56-2 and the sidewall contacts 68-1 associated respectively therewith. Top (frontside) source/drain contacts 68-F and gate contacts (not shown) can comprise electrically conductive material including, but not limited to, a silicide layer such as Ti, Ni, NiPt, and a metal adhesion layer, such as TiN, TaN and conductive metal fills, such as tungsten (W), aluminum (Al), copper (Cu), cobalt (Co), ruthenium (Ru), molybdenum (Mo), or any other suitable conductive material, and combinations thereof. A metal silicide layer can be formed on the source/drain regions 56-2 by depositing a metal liner such as a titanium liner thereon prior to deposition of the metal fill layers. Such a titanium liner can be deposited using physical vapor deposition (PVD), and is followed by annealing at a temperature between about two hundred and eight hundred degrees Centigrade to form the metal silicide. The sidewall contacts 68-1 and the frontside contacts 68-F together form frontside, wrap-around contacts (WACs) that contact the sidewalls as well as the top (front) surfaces of the selected source/drain regions 56-2, as shown in the y cross-sectional direction FIG. 15B. The electrical connection between such WACs and the source/drain regions 56-2 is enhanced by the relatively large contact areas between them. The recesses 66 in the gate cap layer 64 above other source/drain regions 56-1 of the structure 150 remain filled with ILD material at this stage of the fabrication process.

Metal interconnecting wires that connect the devices in the FEOL (device) layer 65, thereby forming electrical circuits, are formed within one or more BEOL layers 75 following MOL processing. The BEOL layers are formed over the front side of the device layer 65. The metal lines including the interconnecting wires are deposited in sequence (e.g., M1, M2, M3, etc.) over the FEOL layer and include dielectric layers. The interconnecting wires within each metal line are electrically connected to interconnecting wires in other metal lines and to the devices in the FEOL (device) layer 65. BEOL processing typically includes low-temperature steps for forming metal wires and preserving temperature sensitive FEOL and MOL structures. BEOL processing involves the formation of interconnect layers above the MOL layer(s). A chip may have multiple BEOL interconnect layers. Each interconnect layer, which has a wiring scheme, is connected to another interconnect layer by vias. The wires and vias are within dielectric layers, one or more of which may comprise low-k material.

A carrier wafer 72 is bonded to the resulting structure and adjoins the BEOL layer(s) 75. The exemplary monolithic semiconductor structure 150 shown in FIG. 15A and FIG. 15B includes an FEOL (device) layer 65 comprising nFET and pFET transistors, sidewall contacts 68-1 adjoining the sidewalls of the source/drain regions 56-1, 56-2 of the transistors, and optionally other electronic devices, and an MOL layer comprising frontside contacts 68-F, BEOL layer (s) 75 electrically connected to the devices in the device layer. The structure 150 further includes a carrier wafer 72. The frontside contacts 68-F and sidewall contacts 68-1 form integral, wrap-around contacts that extend around and over the source/drain regions 56-2 in the device layer 65, forming relatively large contact areas therebetween. The wrap-around contacts electrically connect selected source/drain regions 56-2 to the BEOL layer 75.

Figure 16B:
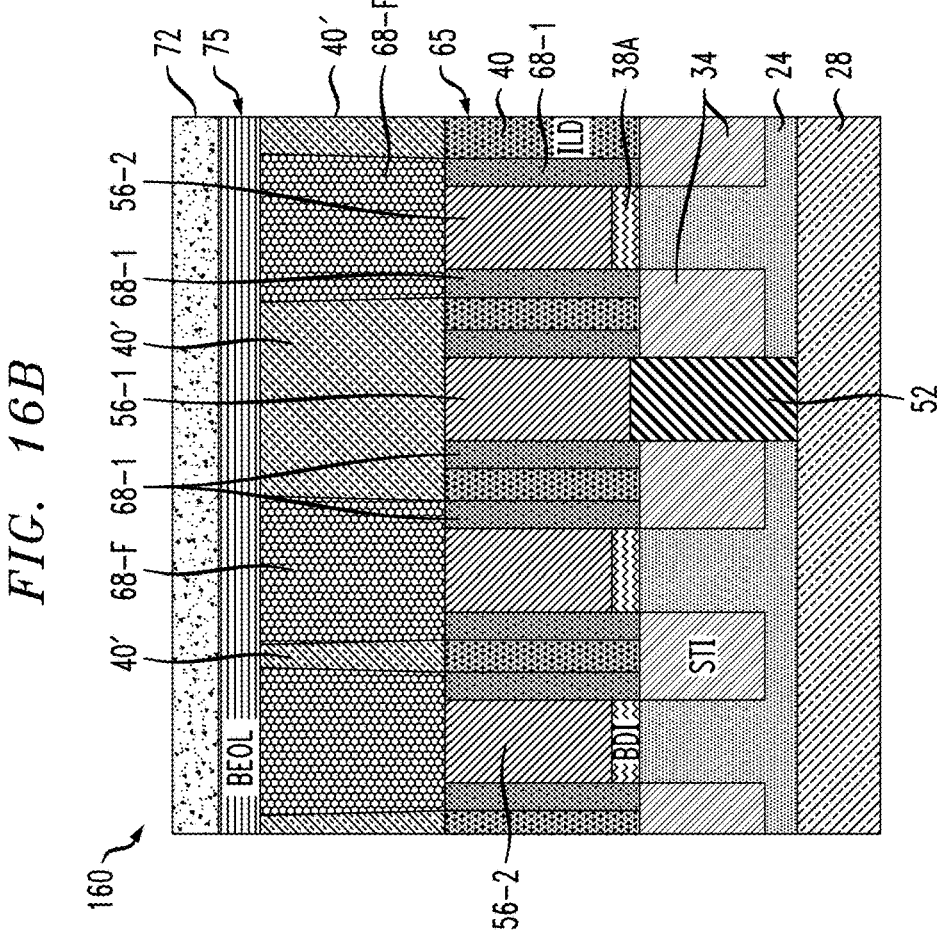
FIG. 16B is a schematic, cross-sectional view thereof taken along the y cross section.
Figure 16A:
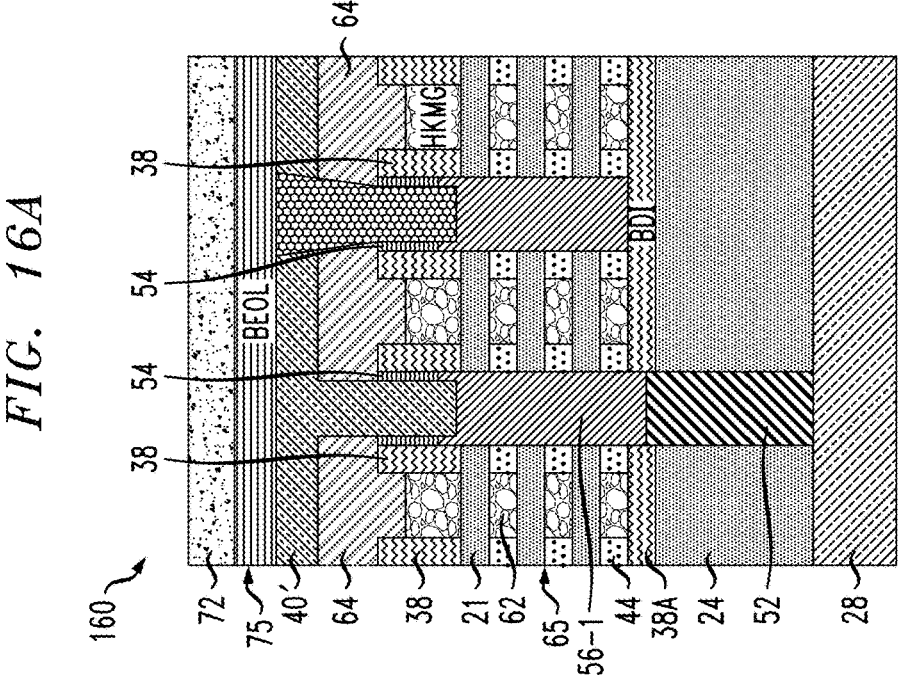
FIG. 16A is a schematic, cross-sectional view of the structure shown in FIG. 15A following removal of a semiconductor substrate layer.
Figure 17B:
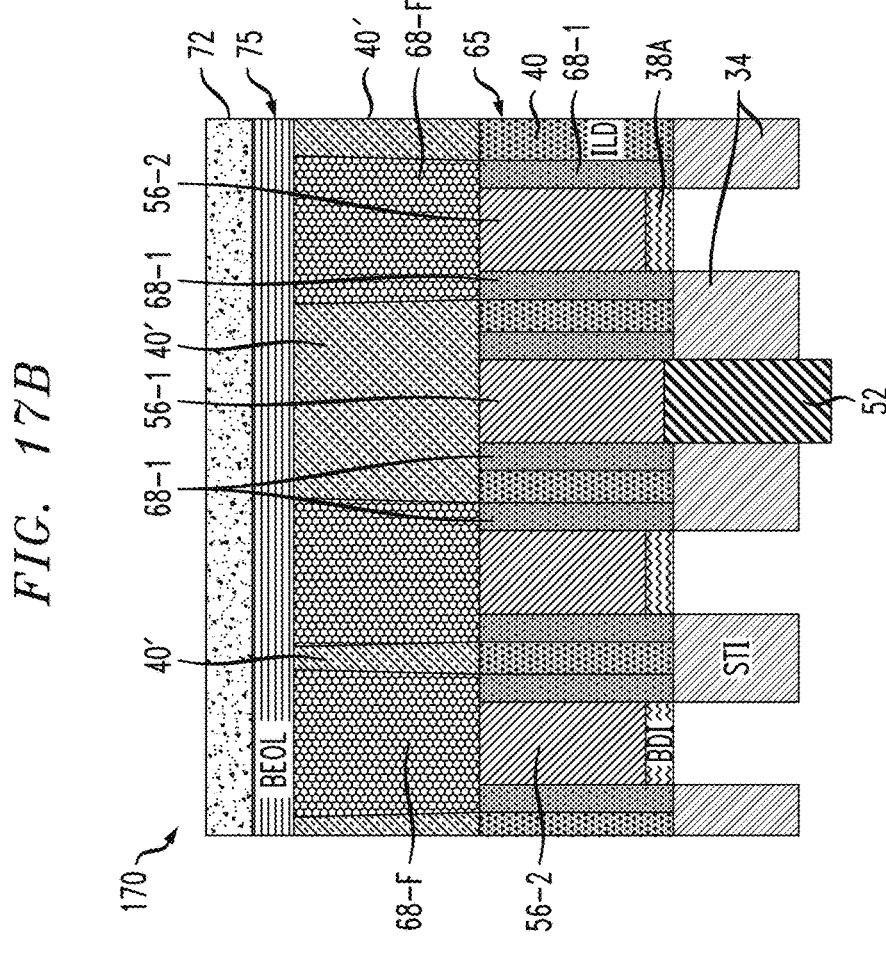
FIG. 17B is a schematic, cross-sectional view thereof taken along the y cross section.
Figure 17A:
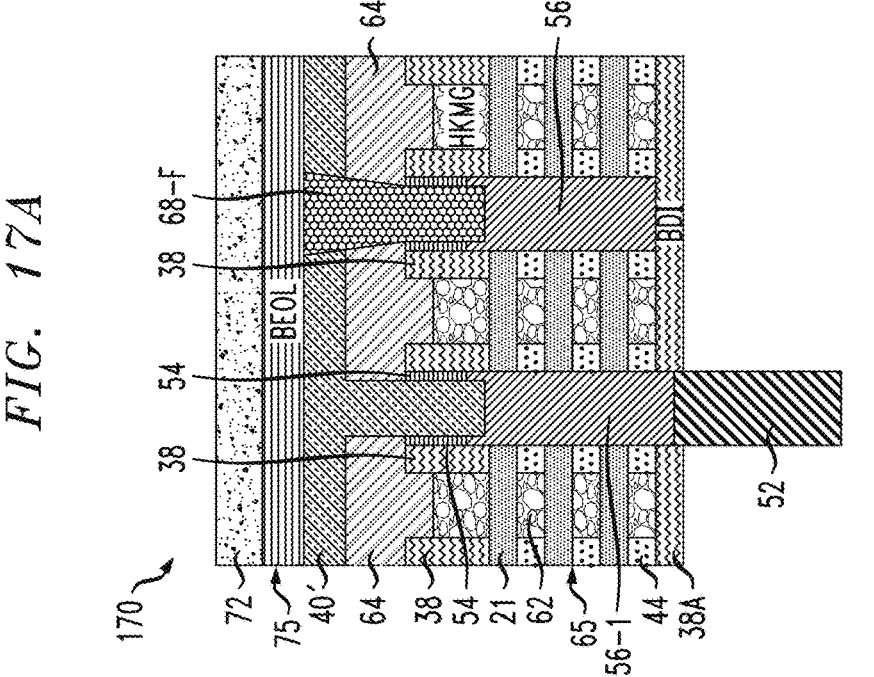
FIG. 17A is a schematic, cross-sectional view of the structure shown in FIG. 16A following removal of an etch stop layer and a further semiconductor substrate layer.

The monolithic structure 150 is flipped and the portion of the silicon substrate layer 24 beneath the etch stop layer 28 is removed therefrom. Ammonium hydroxide (NH$_4$OH) or tetramethylammonium hydroxide (TMAH) may be employed for such removal as their selectivity to silicon germanium is high. (As indicated above, the etch stop layer may comprise silicon germanium.) A monolithic structure 160, as schematically illustrated (shown front side up) in FIG. 16A and FIG. 16B may be obtained. The etch stop layer 28 and the remaining portion of the silicon substrate layer 24 are then selectively removed, thereby obtaining a structure 170 (also shown front side up) as illustrated in FIG. 17A and FIG. 17B. The sacrificial placeholders 52 are exposed on the back side of the structure following such removal.

Figure 18B:
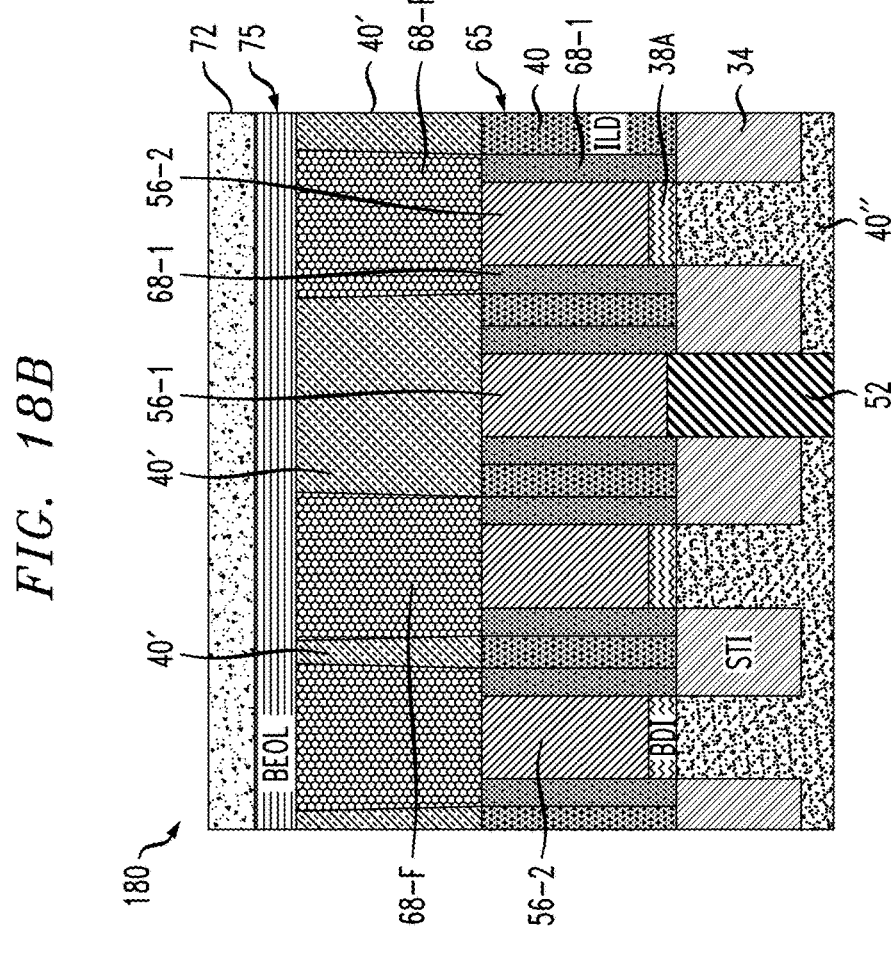
FIG. 18B is a schematic, cross-sectional view thereof taken along the y cross section.
Figure 18A:
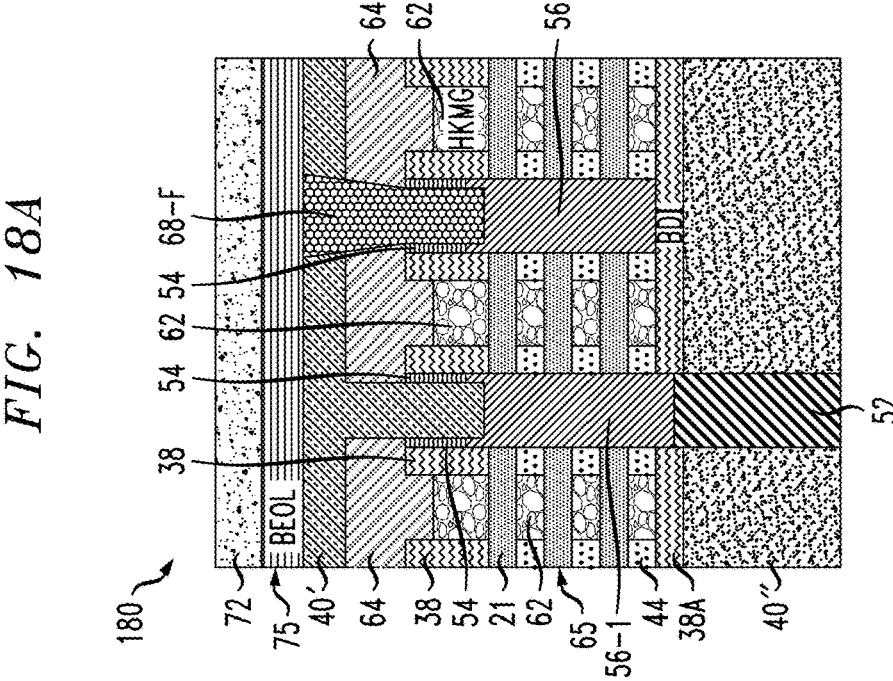
FIG. 18A is a schematic, cross-sectional view of the structure shown in FIG. 17A following deposition and planarization of a backside interlevel dielectric layer.

A backside ILD layer 40" is deposited on the inverted structure 170 and planarized down to the back side surfaces of the sacrificial placeholders 52. The back side surfaces of the sacrificial placeholders are top-facing during such processing. Though not required, the backside ILD layer 40" may have the same composition(s) as the previously formed ILD layers 40, 40' discussed above. The back side surfaces of the sacrificial placeholders 52 are exposed in the resulting structure 180, as shown in FIG. 18A and FIG. 18B.

Figure 19B:
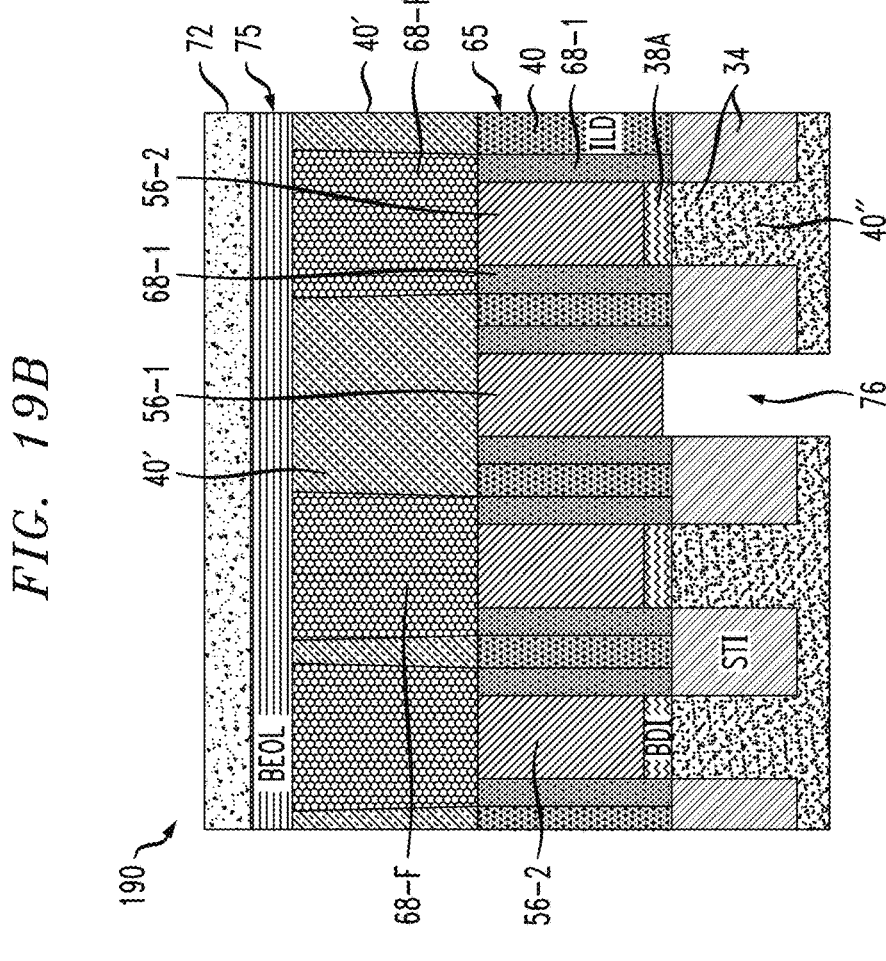
FIG. 19B is a schematic, cross-sectional view thereof taken along the y cross section.
Figure 19A:
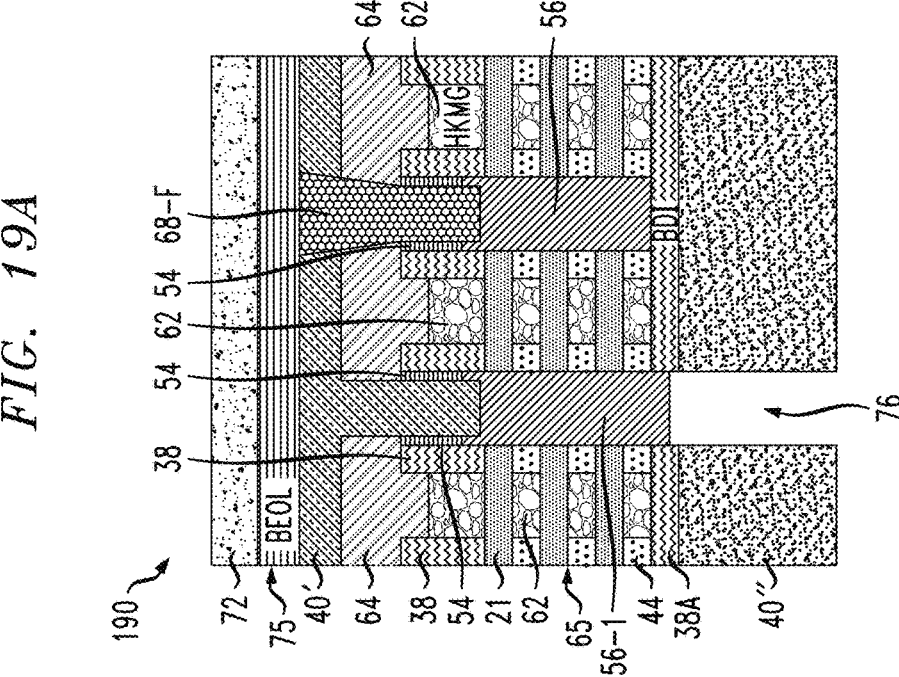
FIG. 19A is a schematic, cross-sectional view of the structure shown in FIG. 18A following sacrificial placeholder removal.
Figure 20B:
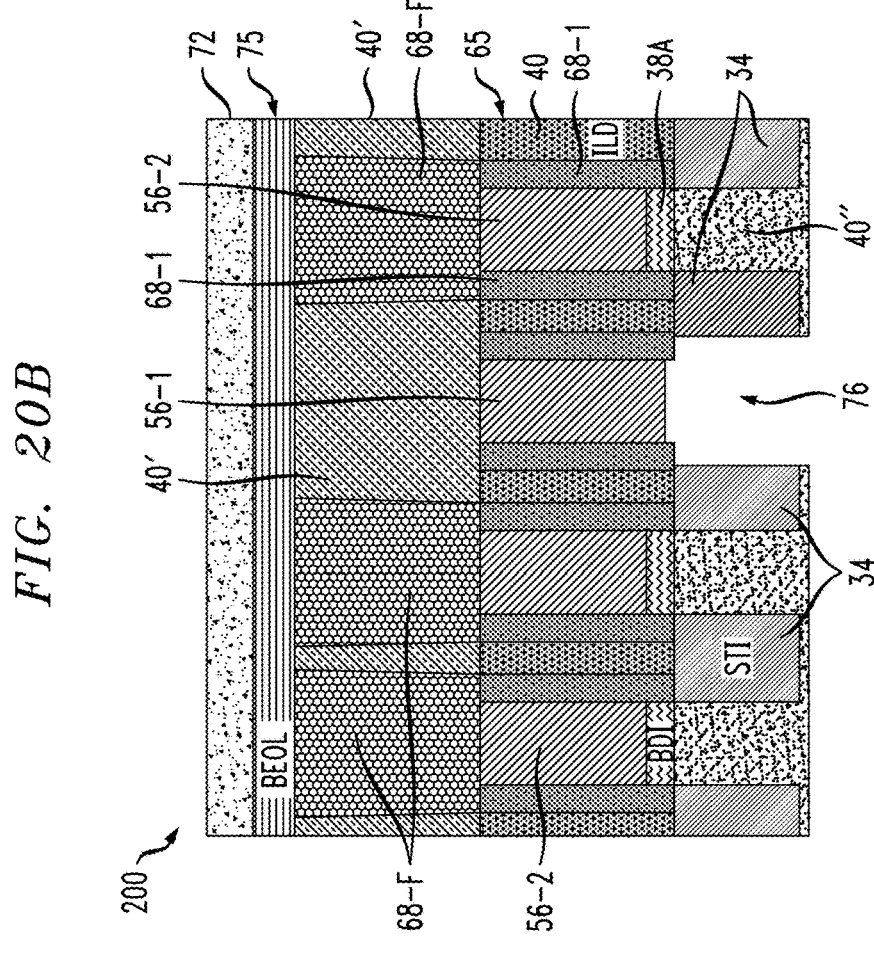
FIG. 20B is a schematic, cross-sectional view thereof taken along the y cross section.
Figure 20A:
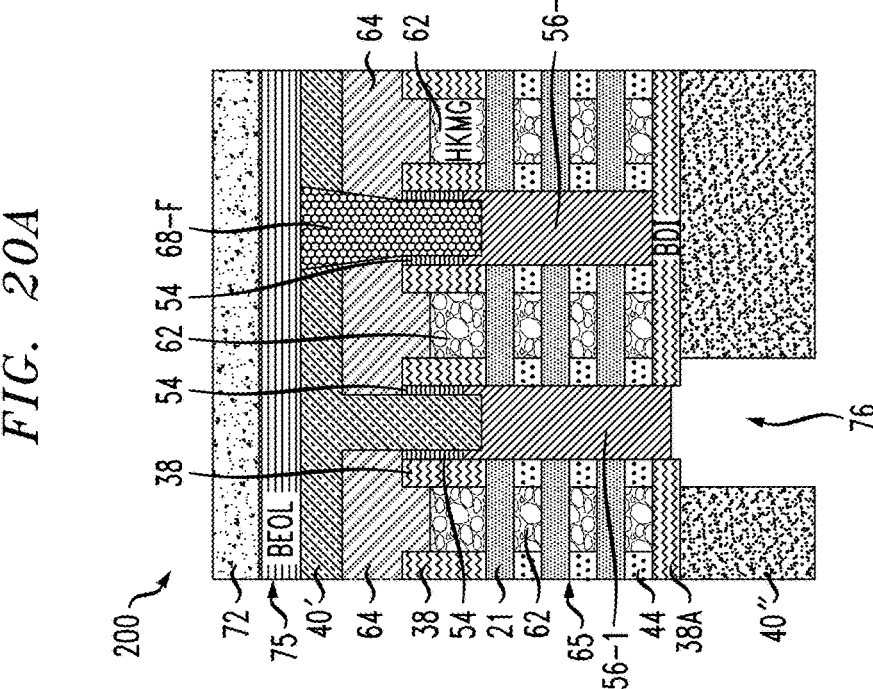
FIG. 20A is a schematic, cross-sectional view of the structure shown in FIG. 19A following a lateral etch of the backside interlevel dielectric layer.

The sacrificial placeholders 52 are selectively removed using conventional dry etch or wet etch processes. Cavities 76 replacing the sacrificial placeholders 52 are formed in the backside ILD layer 40", as shown in FIG. 19A and FIG. 19B. The back surfaces of the source/drain regions 56-1 of the resulting structure 190 are exposed at the top ends of the cavities 76. The cavities 76 are laterally expanded to form a structure 200 as illustrated in FIG. 20A and FIG. 20B. As shown in FIG. 20B, the bottom surfaces of the sidewall contacts 68-1 adjoining the source/drain regions 56-1 are exposed upon lateral expansion of the cavities 76. An isotropic dry or wet etch may be employed to laterally expand the cavities 76. The etching selectively removes portions of the backside ILD layer 40" and STI regions 34 while leaving the source/drain regions 56-1 and sidewall contacts 68-1 on the source/drain regions 56-1 substantially intact.

Backside contact metallization is followed by metal overburden removal to form backside source/drain contacts 68-B. The source/drain sidewall contacts 68-1 and source/drain backside contacts 68-B form integral, wrap-around contact structures that contact the side wall surfaces as well as the back side (bottom) surfaces of the source/drain regions 56-1. The backside source/drain contacts 68-B may or may not comprise the same metal(s)/metal silicide(s) used to form the frontside source/drain contacts 68-F and the sidewall source/drain contacts 68-1. The existence of the BEOL layer 75 at this stage of the process may preclude a high temperature thermal anneal. The relatively large contact areas between the source/drain regions 56-1 and the WACs formed by the backside and sidewall source/drain contacts 68-B, 68-1 helps mitigate possible contact resistance issues arising from the absence of a high temperature thermal anneal during the backside metallization process. As the sidewall source/drain contacts 68-1 are formed on the side walls of source/drain regions 56-1 prior to formation of the BEOL interconnect layer 75, only the portions of the backside wrap-around contact structures that contact the back side surfaces of the source/drain regions 56-1 require consideration of possible temperature limitations due to the BEOL layer 75 during backside metallization and annealing.

Figure 21B:
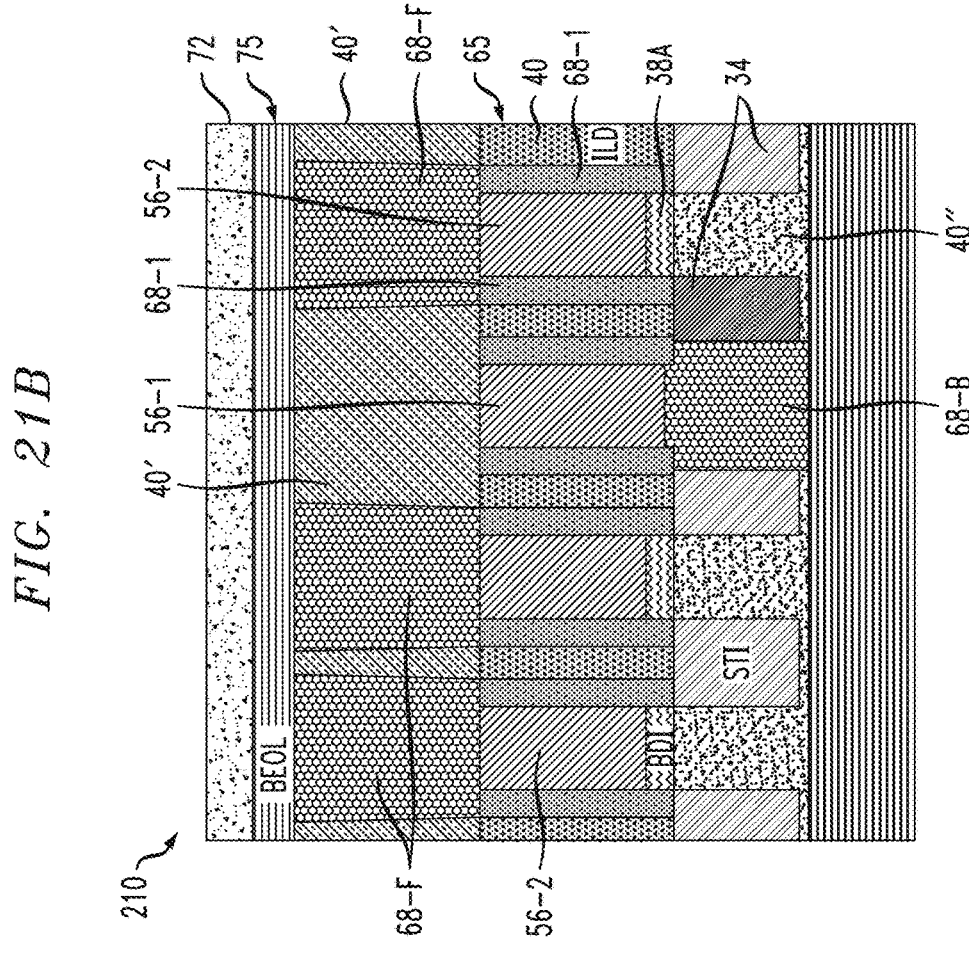
FIG. 21B is a schematic, cross-sectional view thereof taken along the y cross section.
Figure 21A:
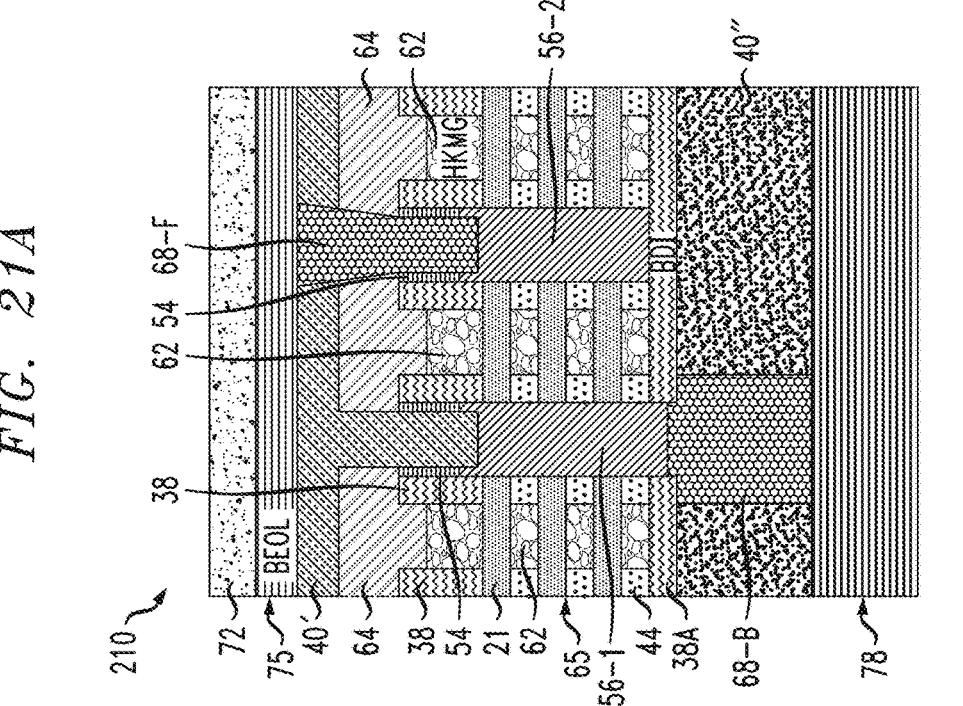
FIG. 21A is a schematic, cross-sectional view of the structure shown in FIG. 20A following backside contact metallization and formation of a backside interconnect layer.

Each backside source/drain contact 68-B has a larger width than the width of the back side surface of the corresponding source/drain region 56-1, the "back side" surface being at the top of the structure during backside metallization following wafer flip as discussed above. The backside source/drain contacts 68-B extend within the backside ILD layer 40". Portions of the backside source/drain contacts 68-B may contact bottom sidewall surfaces of the sidewall source/drain contacts 68-1 as well as the back side (bottom) surfaces thereof, as schematically illustrated in FIG. 21B. As shown in FIG. 21A, top portions of the backside source/drain contacts 68-B may further extend partially within the BDI layer 38A.

Backside interconnect structure(s) are formed over the backside ILD layer 40". In some embodiments, the backside interconnect structure(s) include a backside power rail (BPR) and a backside power delivery network (BSPDN). A backside interconnect structure 78 is schematically illustrated in FIG. 21A and FIG. 21B. The backside source/drain contacts 68-B are electrically connected to the backside interconnect structure 78.

A monolithic semiconductor structure 210 as illustrated in FIG. 21A and FIG. 21B can be obtained using fabrication techniques as discussed above. The structure 210 includes a device layer 65 formed in FEOL processing and has a front side and a back side. Field-effect transistors and possibly other electronic devices (not shown) are incorporated within the device layer. The device layer 65 includes FETs comprising channel regions (stacked silicon nanosheet channel layers 21 in the exemplary structure), source/drain regions 56-1, 56-2 extending laterally from the channel regions, and gate stacks 62, all of which are embedded within an ILD layer 40. A back-end-of-line interconnect layer 75 is positioned over the front side of the device layer 65 and is electrically connected to the field-effect transistors. Sidewall source/drain contacts 68-1 adjoin the side walls of the source/drain regions 56-1, 56-2. Frontside source/drain contacts 68-F adjoin the top surfaces of selected source/drain regions 56-2 and the sidewall source/drain contacts 68-1 associated with such source/drain regions. The frontside source/drain contacts 68-F and sidewall source/drain contacts 68-1 form integral, wrap-around contact structures that are employed to electrically connect the source/drain regions 56-2 with the BEOL interconnect layer 75. Backside source/drain contacts 68-B adjoin the back side surfaces of other selected source/drain regions 56-1 and the sidewall source/drain contacts 68-1 associated with such source/drain regions. The backside source/drain contacts 68-B and sidewall source/drain contacts 68-1 form integral, wrap-around contact structures that are employed to electrically connect the source/drain regions 56-1 with the backside interconnect layer 78. A bottom dielectric isolation layer 38A beneath the gate stacks 62 also extends over portions of the top surfaces of the backside source/drain contacts 68-B, as shown in FIG. 21A.

In some embodiments, a field-effect transistor (or a plurality of FETs) within the device layer 65 includes one source/drain region 56-2 electrically connected by a frontside contact 68-F to the BEOL layer 75 and another source/drain region 56-1 electrically connected by a backside contact 68-B to the backside interconnect layer 78. Some FETs in the device layer 65 may have source/drain regions that are electrically connected only to the BEOL interconnect layer 75 by frontside contacts while the source/drain regions of other FETs may be electrically connected only to the backside interconnect layer 78 by backside contacts. In embodiments where the backside interconnect layer 78 comprises signal wires and power wires rather than just power wires, an integrated circuit comprising the FETs may have both source/drain regions of the FETs electrically connected to the backside interconnect layer by backside contacts. Wrap-around contact structures that provide contact with source/drain sidewall surfaces as well as top or bottom source/drain surfaces allow greater silicide areas for both frontside and backside contacts. By providing source/drain sidewall contacts 68-1 that extend entirely through the device layer 65 prior to frontside and backside contact formation, the provision of wrap-around source/drain contacts on both sides of the device layer is facilitated.

The drawing figures as discussed above depict exemplary processing steps/stages in the fabrication of exemplary structures. Although the overall fabrication methods and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* 1$^{st}$ *Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having, for example, FET devices and contacts formed in accordance with one or more of the exemplary embodiments.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" and "vertical" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b). It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A monolithic semiconductor structure, comprising:
a device layer having a front side and a back side, the
device layer comprising:
an interlevel dielectric layer;
a field-effect transistor within the interlevel dielectric
layer, the field-effect transistor including a channel
region and first and second source/drain regions
extending laterally from the channel region, each of
the first and second source/drain regions including a
top surface, a bottom surface, and side wall surfaces
extending between the top surface and the bottom
surface;
a first metal source/drain sidewall contact directly
contacting the side wall surfaces of the first source/
drain region, the first metal source/drain sidewall
contact having a top end and a bottom end; and
a second metal source/drain sidewall contact directly
contacting the side wall surfaces of the second
source/drain region, the second metal source/drain
sidewall contact having a top end and a bottom end;
a backside source/drain contact comprising metal and
directly contacting the bottom surface of the first
source/drain region and the bottom end of the first
metal source/drain sidewall contact, the backside
source/drain contact electrically connected to three
sides of the first source/drain region;
a middle-of-line dielectric layer directly contacting and
electrically insulating the top surface of the first source/
drain region and the top end of the first metal source/
drain sidewall contact; and
a frontside source/drain contact comprising metal and
directly contacting the top surface of the second source/
drain region and the top end of the second metal
source/drain sidewall contact.

2. The monolithic semiconductor structure of claim 1,
further including:
a back-end-of-line interconnect layer over the front side
of the device layer, the frontside source/drain contact
being electrically connected to the back-end-of-line
interconnect layer; and
a backside interconnect layer over the back side of the
device layer, the backside source/drain contact being
electrically connected to the backside interconnect
layer.

3. The monolithic semiconductor structure of claim 2,
further including a bottom dielectric isolation layer adjoin-
ing the bottom surface of the second source/drain region and
a top end of the backside source/drain contact.

4. The monolithic semiconductor structure of claim 2,
further including:
the middle-of-line dielectric layer between the device
layer and the back-end-of-line interconnect layer, the
frontside source/drain contact extending through the
middle-of-line dielectric layer; and
a backside dielectric layer between the device layer and
the backside interconnect layer, the backside source/
drain contact extending through the backside dielectric
layer.

5. The monolithic semiconductor structure of claim 4,
wherein the channel region comprises a stack of nanosheet
semiconductor layers.

6. The monolithic semiconductor structure of claim 5,
further including:
a gate stack between the nanosheet semiconductor layers;
and a bottom dielectric isolation layer adjoining the gate
stack, the bottom surface of the second source/drain
region, and a top end of the backside source/drain
contact.

7. The monolithic semiconductor structure of claim 5,
further including a carrier wafer bonded to a top surface of
the back-end-of-line interconnect layer.

8. The monolithic semiconductor structure of claim 5,
wherein the first metal source/drain sidewall contact and the
second metal source/drain sidewall contact comprise a metal
silicide layer.

9. A monolithic semiconductor structure, comprising:
a device layer including a front side and a back side, the
device layer comprising:
field-effect transistors;
an interlevel dielectric layer, the field-effect transistors
being positioned within the interlevel dielectric
layer;
each of the field-effect transistors including a channel
region and first and second source/drain regions
extending laterally from the channel region, each of
the first and second source/drain regions including a
top surface, a bottom surface, and side wall surfaces
extending between the top surface and the bottom
surface; and
source/drain sidewall contacts comprising metal and
adjoining, respectively, the side wall surfaces of the
first and second source/drain regions of each of the
field-effect transistors, each of the source/drain side-
wall contacts having a top end and a bottom end;
backside source/drain contacts extending from the back
side of the device layer, each of the backside source/
drain contacts comprising metal and directly contact-
ing, respectively, the bottom surface of the first source/
drain region of one of the field-effect transistors and the
bottom end of one of the source/drain sidewall contacts
on the side wall surfaces of the first source/drain region
of the one of the field-effect transistors, the backside
source/drain contacts electrically connecting, respec-
tively, to three sides of the first source/drain region of
the one of the field-effect transistors; and
a middle-of-line dielectric layer directly contacting and
electrically insulating, respectively, the top surface of
the first source/drain region of the one of the field-effect
transistors and the top end of the one of the source/drain
sidewall contacts on the side wall surfaces of the first
source/drain region of the one of the field-effect tran-
sistors.

10. The monolithic semiconductor structure of claim 9,
wherein the device layer comprises an integrated circuit and
the second source/drain regions of a plurality of the field-
effect transistors are electrically connected, respectively, to
frontside source/drain contacts extending from the front side
of the device layer.

11. The monolithic semiconductor structure of claim 9,
further including a bottom dielectric isolation layer adjoin-
ing the bottom surfaces of the second source/drain regions
and a top end of each of the backside source/drain contacts.

12. The monolithic semiconductor structure of claim 9,
further including:
frontside source/drain contacts extending from the front
side of the device layer, each of the frontside source/
drain contacts comprising metal and directly contact-
ing, respectively, the top surface of one of the second
source/drain regions and the top end of one of the
source/drain sidewall contacts on the side wall surfaces
of the one of the second source/drain regions;

a back-end-of-line interconnect layer over the front side of the device layer, the frontside source/drain contacts being electrically connected to the back-end-of-line interconnect layer; and a backside interconnect layer over the back side of the device layer, the backside source/drain contacts being electrically connected to the backside interconnect layer.

13. The monolithic semiconductor structure of claim 12, further including the middle-of-line dielectric layer between the device layer and the back-end-of-line interconnect layer, the frontside source/drain contacts extending through the middle-of-line dielectric layer; and a backside dielectric layer between the device layer and the backside interconnect layer, the backside source/drain contacts extending through the backside dielectric layer.

14. The monolithic semiconductor structure of claim 13, wherein the channel region of each of the field-effect transistors comprises a stack of nanosheet semiconductor layers.

15. The monolithic semiconductor structure of claim 14, further including:

a gate stack between the nanosheet semiconductor layers of each of the field-effect transistors; and a bottom dielectric isolation layer adjoining the gate stack, the bottom surfaces of each of the second source/drain regions, and a top end of each of the backside source/drain contacts.

16. The monolithic semiconductor structure of claim 15, further including a carrier wafer bonded to a top surface of the back-end-of-line interconnect layer.

17. A method of fabricating a monolithic semiconductor structure including a backside contact and a frontside contact, comprising:

obtaining a device layer having a front side and a back side, the device layer comprising:

an interlevel dielectric layer; and a field-effect transistor within the interlevel dielectric layer, the field-effect transistor including a channel region and first and second source/drain regions extending laterally from the channel region, each of the first and second source/drain regions including a top surface, a bottom surface, and side wall surfaces extending between the top surface and the bottom surface;

forming a first metal source/drain sidewall contact directly on the side wall surfaces of the first source/ drain region and a second metal source/drain sidewall contact directly on the side wall surfaces of the second source/drain region, the first metal source/drain sidewall contact and the second metal source/drain sidewall contact each having a top end and a bottom end;

forming a frontside source/drain contact comprising metal directly on the top surface of the second source/drain region and the top end of the second metal source/drain sidewall contact;

forming a backside source/drain contact comprising metal directly on the bottom surface of the first source/drain region and the bottom end of the first metal source/drain sidewall contact, the backside source/drain contact electrically connecting to three sides of the first source/drain region; and forming a middle-of-line dielectric layer directly on and electrically insulating the top surface of the first source/drain region and the top end of the first metal source/drain sidewall contact.

18. The method of claim 17, further including a substrate on the back side of the device layer and a sacrificial placeholder extending within the substrate, the sacrificial placeholder being directly beneath the first source/drain region, further comprising:

removing the substrate;

forming a backside interlevel dielectric layer on the back side of the device layer;

removing the sacrificial placeholder, thereby forming a cavity in the backside interlevel dielectric layer and exposing the bottom surface of the first source/drain region; and wherein forming the backside source/drain contact further includes filling the cavity with contact metal.

19. The method of claim 18, wherein the device layer further includes a bottom dielectric isolation layer extending beneath the second source/drain region, wherein the backside interlevel dielectric layer is formed in part on the bottom dielectric isolation layer.

20. The method of claim 18, further including;

forming a back-end-of-line interconnect layer over the device layer;

bonding a carrier wafer to the back-end-of-line interconnect layer; and forming a backside interconnect layer on the backside interlevel dielectric layer.

* * * * *